(12) United States Patent
Cohen

(10) Patent No.: US 9,819,311 B2
(45) Date of Patent: Nov. 14, 2017

(54) APPARATUS AND A METHOD FOR PROVIDING A SUPPLY CONTROL SIGNAL FOR A SUPPLY UNIT

(71) Applicant: Intel IP Corporation, Santa Clara, CA (US)

(72) Inventor: Emanuel Cohen, Zichron Yaacov (IL)

(73) Assignee: Intel IP Corporation, Santa Clara, CA (US)

( * ) Notice: Subject to any disclaimer, the term of this patent is extended or adjusted under 35 U.S.C. 154(b) by 101 days.

(21) Appl. No.: 14/631,901

(22) Filed: Feb. 26, 2015

(65) Prior Publication Data

US 2015/0280652 A1 Oct. 1, 2015

(30) Foreign Application Priority Data

Mar. 28, 2014 (DE) .................. 10 2014 104 364

(51) Int. Cl.
| | | |
|---|---|---|
| H03F 1/30 | (2006.01) | |
| H03F 1/02 | (2006.01) | |
| H03F 3/19 | (2006.01) | |
| H03F 3/21 | (2006.01) | |
| H03F 3/24 | (2006.01) | |

(52) U.S. Cl.
CPC ......... *H03F 1/0222* (2013.01); *H03F 1/0227* (2013.01); *H03F 3/19* (2013.01); *H03F 3/21* (2013.01); *H03F 3/245* (2013.01); *H03F 2200/102* (2013.01); *H03F 2200/336* (2013.01); *H03F 2200/432* (2013.01); *H03F 2200/451* (2013.01)

(58) Field of Classification Search
CPC ...................................... H03F 1/30
USPC ................... 330/297, 296, 285, 129
See application file for complete search history.

(56) References Cited

U.S. PATENT DOCUMENTS

| | | | | |
|---|---|---|---|---|
| 8,258,875 B1* | 9/2012 | Smith | ............. | H03F 1/0227 330/127 |
| 8,400,217 B2* | 3/2013 | Drogi | ............. | H03F 1/0227 330/129 |
| 8,456,145 B2* | 6/2013 | Fang | ............. | G06F 1/3203 323/266 |
| 8,493,014 B2* | 7/2013 | Henderson | ......... | H02P 21/0089 318/400.22 |
| 8,582,647 B2* | 11/2013 | Shah | ............. | H04N 19/197 375/240.05 |
| 9,189,041 B2* | 11/2015 | Bai | ............. | H04W 52/146 |
| 2003/0107440 A1* | 6/2003 | Miki | ............. | H03F 1/0211 330/297 |
| 2013/0290744 A1* | 10/2013 | Bai | ............. | H04W 52/146 713/300 |
| 2013/0336372 A1* | 12/2013 | Lee | ............. | H04B 7/0413 375/219 |
| 2015/0280652 A1* | 10/2015 | Cohen | ............. | H03F 1/0222 330/297 |

\* cited by examiner

*Primary Examiner* — Henry Choe
(74) *Attorney, Agent, or Firm* — Eschweiler & Potashnik, LLC

(57) ABSTRACT

An apparatus for providing a supply control signal for a supply unit, the supply unit being configured to provide a variable controlled power supply to the power amplifier. The apparatus includes a determination module configured to determine a deviation of a signal from at least one nominal value; and an adjustment module configured to provide the supply control signal after an adjustment based on the determined deviation.

13 Claims, 17 Drawing Sheets

US 9,819,311 B2

APPARATUS AND A METHOD FOR PROVIDING A SUPPLY CONTROL SIGNAL FOR A SUPPLY UNIT

TECHNICAL FIELD

The present disclosure relates to an apparatus and a method for providing a supply control signal for a supply unit and, in particular, to a time domain open loop envelope tracking compensation for bandwidth enhancement.

BACKGROUND

High-efficiency power amplifiers (PAs) are critical in portable battery-operated wireless communication. With modern wireless systems, the modulation format has a high envelope peak-average ratio (PAR) and implemented linear power amplifiers have a low average efficiency. Power supply control schemes as envelope tracking (ET) offer a great potential of high average efficiency operation for high PAR signals, for example, up to a factor of two. However, due to the bandwidth limitations of the DC/DC converter, the traditional dynamic supply control schemes are typically limited to narrow-bandwidth applications of few MHz. Most envelope tracking solutions today are "hybrid" and include a DC/DC converter and a fast linear regulator. This results in a complex system with reduced efficiency.

SUMMARY

There is a demand of providing an apparatus and a method for increasing the efficiency of power amplifiers for bandwidth enhancement.

This demand may be satisfied by the subject matter of the claims.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1A:
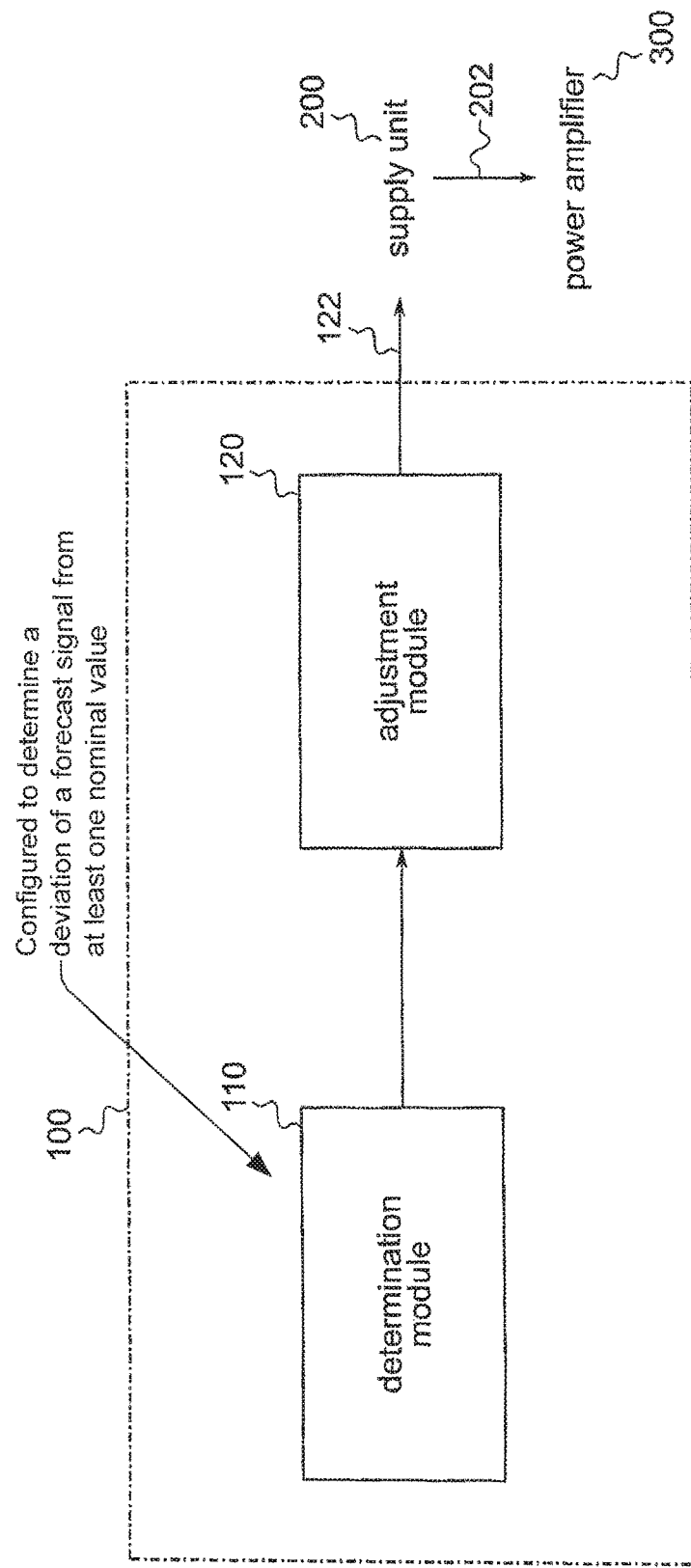
FIG. 1A depicts a block diagram of an apparatus for providing a supply control signal.

FIG. 1A depicts an apparatus 100 for providing a supply control signal 122 for a supply unit 200, wherein the supply unit 200 is configured to control a power amplifier 300 of a wireless transmission device (not shown) by providing a variable controlled power supply 202 to the power amplifier 300. The apparatus 100 comprises a determination module 110 which is configured to determine a deviation of a forecast signal from at least one nominal value, wherein the forecast signal is based on at least one characteristic parameter of the supply unit 200. The apparatus 100 further comprises an adjustment module 120 which is configured to provide the supply control signal 122 after an adjustment based on the determined deviation and an envelope tracking signal 102.

The at least one nominal value (default value) may indicate a value of the variable controlled power supply 202 to be supplied by the supply unit 200 for a constant or slowly varying load of the power amplifier 300, wherein the power amplifier 300 amplifies an RF signal to a desired level or value (e.g. needed for a receiver to correctly interpret the received signal). However, at least for quickly changing impedances (internal or external) of the power amplifier 300 or if the power amplifier 300 is operated at a high frequency (e.g. amplifying a transmit signal with fast varying symbols to be transmitted), the variable controlled power supply 202 may not be re-adjusted sufficiently fast to maintain the power amplifier 300 with the desired characteristic, e.g. to generate an output signal with a desired amplitude. Therefore, by relying on the default value the power amplifier 300 would need a comparable long time to provide the desired amplified RF signals—which may be too long for high operation frequencies. The apparatus may overcome this deficiency by modifying the supply control signal 122 based on the deviation from the default value, wherein the modification may predict or pre-calculate the behavior of the power amplifier 300 and/or the supply unit to achieve a fast re-adjustment of the operation mode of the power amplifier 300.

The characteristic parameter of the supply module may be a parameter indicating a behavior of the supply module. For example, the characteristic parameter may be an impedance of the supply module, a parameter indicating a voltage or a current to be supplied by the supply module or a voltage or a current provided by the supply module for a constant or slowly varying load of the power amplifier. In this connection, the load of the power amplifier may be a magnitude (e.g. amplitude) of a signal to be amplified. A constant load may be a constant signal and a slowly varying load may be a signal comprising a slowly varying amplitude (e.g. die to a slow symbol rate). A slow variation may be a variation significantly lower than a maximal variation of the power supply, which can be provided by the supply unit. For example, a signal with a frequency or symbol rate below 1 MHz (or below 500 kHz) may be a slowly varying signal, while a signal with a frequency or symbol rate above 1 MHz (or above 10 MHz or above 50 MHz) may be a fast varying signal.

The forecast signal may indicate information on a voltage or a current desired to be provided by the supply unit to the power amplifier for a fast varying load of the power amplifier, for example. The forecast signal may be determined based on the envelope tracking signal, for example.

The supply unit 200 comprises, for example, a DC/DC converter that is configured to convert one direct current (or voltage) signal into another direct current (or voltage) signal. The conversion of such DC/DC converter may be controlled by a control signal (as the supply control signal 122). In some systems this control signal may be received directly from a lookup table (LUT) unit or a digital/analog converter (DAC), which may be interposed between the LUT unit and the DC/DC converter. The LUT unit may be part of an envelope tracking module being configured to control the DC/DC converter. In some systems the envelope tracking DC/DC system may be designed as a closed loop by using a feedback loop.

In another example, the power amplifier 300 is configured to amplify a transmit signal and the determination module 110 is configured to determine a correction signal based on at least one characteristic parameter of the supply unit 200 and the adjustment module 120 is configured to provide the supply control signal 122 based on the correction signal and an input control signal 102 containing information on an envelope of the transmit signal to be amplified by the power amplifier 300.

More details and aspect are described in connection with further examples mentioned above and below.

Figure 1B:
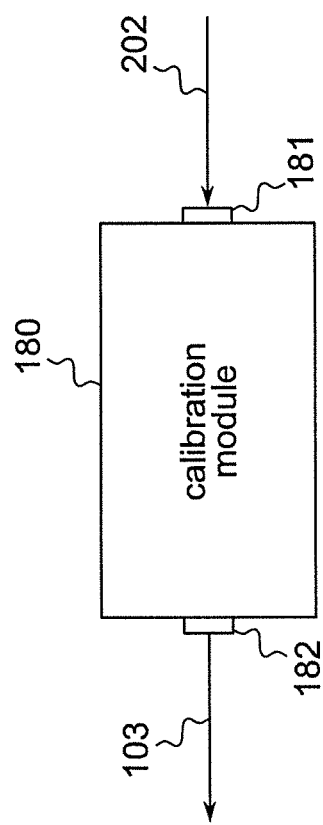
FIG. 1B depicts a block diagram of an apparatus for providing a calibration signal.

FIG. 1B depicts an apparatus 180 for providing a calibration signal 103 for a supply control signal 122 for a supply unit (not shown in FIG. 1B) using a feedback loop to adapt or correct a supply control signal, wherein the supply unit is configured to provide a variable controlled power supply 202 based on the supply control signal to the power amplifier (not shown in FIG. 1B). The apparatus 180 comprises an input 181 to receive a variable controlled power supply 202 from an output of the supply unit 200 and an output 182 to provide a calibration signal 103 configured to correct the supply control signal 122; and a calibration module configured to determine the calibration signal 103 based on the variable controlled power supply 202 and based on an envelope tracking signal.

Figure 2:
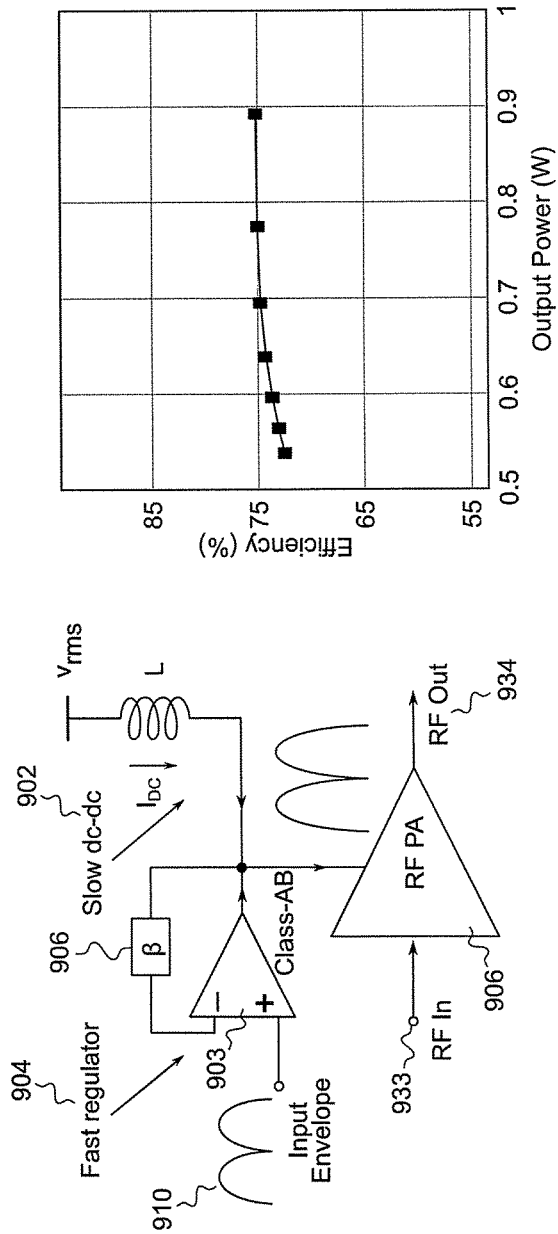
FIG. 2 depicts an envelope tracking implementation.

FIG. 2 depicts a system implemented as a hybrid envelope tracking solution. On the left-hand side a schematic view of the system is depicted, whereas on the right-hand side the corresponding system efficiency as function of the output power for an LTE 20 (LTE with 20 MHz bandwidth) is shown.

This system comprises a slow DC/DC converter 902, a fast regulator 904, and a radio frequency power amplifier (RF PA) 906. The fast regulator 904 comprises a comparator 903 and a feedback loop connecting the output of the comparator 903 (e.g. class AB) with the inverted input of the comparator 903 and comprises a feedback coupling unit 906 providing a feedback coupling "β". The non-inverted input of the comparator 903 is configured to receive an input envelope signal 910. The output of the comparator 903 is connected to the output of the slow DC/DC converter 902, which in turn comprises in this example an inductance L and connects the output of the comparator 903 with a voltage supply $V_{rms}$. Furthermore, the output of the comparator 903 is connected to the control input of the RF power amplifier 906 which is connected between an RF input 933 and an RF output 934.

In this hybrid envelope tracking system combining the DC/DC converter 902 with a fast regulator 904, the regulator 904 has only a low efficiency and at high bandwidth operations the overall efficiency of the DC system drops to around 75% (see right-hand side of FIG. 2).

However, with the fastest processes today such closed loop systems cannot adapt to changes in the loop at the order of tens of MHz occurring in new standards for WiFi and LTE and they are, therefore, not suitable for future expansions.

On the other hand, since the transmitted data and the power amplifier are controlled, it is possible to pre-calculate the dynamics of the system and to inject into the envelope tracking loop a signal that will turn into a desired signal at the power amplifier supply. This pre-calculation can, in an example, be done by a digital signal processing unit as will be set out in more detail below (see FIG. 6). This increases the effective bandwidth of the envelope tracking system by more than a factor of three.

Implementing this idea, the present disclosure may correct the signal to be input into the DC/DC converter 200 by using the proposed concept or one or more examples mentioned above (e.g. the apparatus 100). Therefore, the apparatus 100 may implement an open loop compensation which may be injected in an envelope tracking DC/DC system designed as a closed loop. This open loop compensation can be implemented without any additional power penalty. Using the apparatus 100 and, optionally, implementing the following modifications, there is no need for the inefficient regulator. Instead a faster DC/DC converter is used which works at switching frequencies of above 100 MHz and maintains still excellent efficiency above 90%, for example, in 28 nm process technology or another semiconductor process technology.

However, despite the faster DC/DC converter the bandwidth of the closed loop may still not be sufficient to cope with power amplifier load variations which are to encounter at modern transmission systems. Therefore, according to further examples, a calibration loop is added. The calibration loop changes the envelope data delivered to the DC/DC converter 200 to compensate expected load variations for the power amplifier 300.

Figure 3:
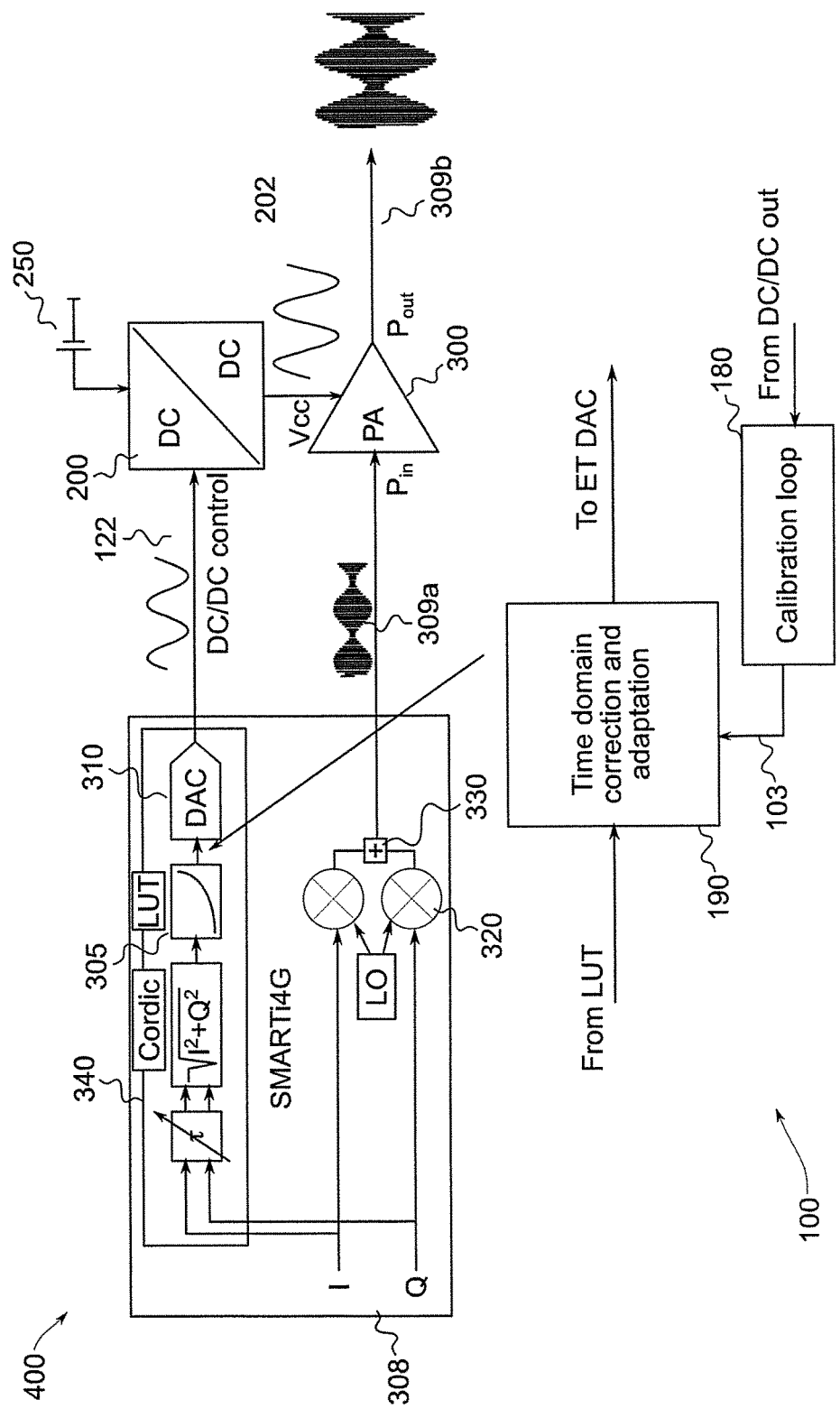
FIG. 3 depicts an apparatus with a fast switching DC/DC converter to provide an open loop correction with a calibration feedback for bandwidth expansion.

FIG. 3 depicts an example of an integration of the apparatus 100 in a system 400 which may be implemented in a wireless transmission device. The system 400 comprises a signal path and an envelope tracking path.

The system 400 may comprise a modulator 320 and a multiplexer 330 along the signal path. The modulator 320 receives and modulates the digital input signals 308, for example, the signals I, Q (the in-phase and quadrature component), and the multiplexer 330 may be configured to provide a multiplexed signal 309a to the power amplifier 300 as input signal.

The system 400 may comprise an envelope tracking unit 340 and a mapping unit 305 (e.g. a LUT unit) along the envelope tracking path. The envelope tracking unit 340 may be configure to receive and analyze the digital signals 308, which are subsequently mapped by the mapping unit 305. Therefore, the envelope tracking unit 340 performs an envelope tracking on the components I, Q in that, for example, the time-varying amplitude (envelop) of the 2-dimensional vector is determined and is input into the LUT unit 305. The LUT unit 305 maps the envelope to a voltage based on the behavior of the power amplifier 300 and the defined track.

In some systems, the output of the lookup table 305 is input into the digital analog converter (DAC) 310 to provide a DC/DC control signal to the DC/DC converter 200. The DC/DC converter 200 has an output providing a variable controlled power supply 202 to the power amplifier 300 which, based on the supplied control signal 202, provides an amplification of the RF input signal 309a to generate the amplified RF output signals 309b. The variable controlled power supply 202 may be supplied to a supply port of the power amplifier 309 as Vcc signal (voltage and current supply).

The system 400 may further comprise a power supply 250 which is configured to provide a DC power supply to the supply unit 200, which may be a DC/DC supply unit.

In this example (e.g. a transmitter or transceiver of a mobile device), the apparatus 100 is interposed between the LUT unit 305 and the digital analog converter (DAC) 310 along the envelope tracking path. Thus, the DC/DC converter 200 receives the output signal of the apparatus 100 to control the power amplifier 300 based thereon, e.g. the variable controlled power supply 202 is corrected by the supply control signal 122 generated by the apparatus 100.

The apparatus 100 arranged between the lookup table unit 305 and the DAC 310 may include a time domain correction and adaptation unit 190 to correct the signal output from the lookup table unit 305 before it is input in the digital analog converter 310 and transmitted to the DC/DC converter 200. The apparatus 100 may further comprise a control input to receive a closed loop control signal 103 (calibration signal) which is provided from the output of the DC/DC converter 200. An optional calibration unit 180 is configured to calibrate the loop signal (in the closed loop) by providing the calibration signal 103. Therefore, the calibration loop changes the envelope data delivered to the DC/DC converter 200 and may be configured to compensate the expected load variations for the power amplifier 300.

This system 400 may increase, as a result, the overall efficiency of the full new DC system close to (or even more) 90% for LTE 20 and LTE 40 with carrier aggregation of, e.g., better than 85% for WiFi 80. The bandwidths of 40 MHz and 80 MHz are not even addressed today by conventional hybrid envelope tracking solutions.

By including the apparatus 100 in the path after the lookup table unit 305 an additional time domain equalization of the output voltage signal based on the DC/DC response and the power amplifier load behavior is achieved to correct the power amplifier and the DC/DC interaction. This may improve the power amplification, wherein the envelope tracking implementation comprises only a direct lookup table that maps the envelope to a voltage based on the power amplifier behavior and the defined track.

The time domain corrections and adaptation block 190 in the apparatus 100 of this disclosure may, for example, perform a transformation which can be expressed by the following equation:

$$V_{in} = CL^{-1}\left[Z_{DC\_DC} \cdot (1-CL)\left(\frac{V_{PA}}{R_{opt}} - I_{PA}(V_{PA})\right) + V_{PA}\right]. \quad (1)$$

In this equation the term $V_{PA}$ denotes the voltage that the power amplifier 300 would need for amplifying a constant or slowly varying signal, $V_{PA}/R_{opt}$ represents the current that the DC/DC converter 200 may provide to the power amplifier for amplifying a constant or slowly varying signal (e.g. nominal value), whereas $I_{PA}$ is the actual current to be provided to the power amplifier 300 for a fast varying signal (e.g. characteristic parameter or information derived from a characteristic parameter), the term (1−CL) represents the DC/DC closed loop response, and $Z_{DC\_DC}$ represents the output impedance of the DC/DC converter (i.e. of the open loop). Finally, $CL^{-1}$ is the inverse DC/DC close loop transfer function (wherein the closed loop extends from the input of the calibration unit 180 to the output of the apparatus 100).

According to equation (1) the DC/DC correction can be described as follows, wherein all transformations/manipulations described in the following relates to digital or analog signals which indicate the respective values (voltages, current, impedances etc.) or their transformations/manipulations.

At first, the current difference (e.g. deviation) between the basic DC/DC assumption of constant power amplifier load ($V_{PA}/R_{opt}$, e.g. representing a nominal value) and the actual current of the power amplifier ($I_{PA}$, e.g. characteristic parameter or information derived from a characteristic parameter) is calculated. Then, this current is multiplied with the actual DC/DC impedance, which is a product of the closed loop impedance response (1−CL) with the open loop impedance ($Z_{DC/DC}$). This is a voltage noise created at the power amplifier supply. The result (e.g. representing the correction signal) is then summed with the actual voltage $V_{PA}$ needed (e.g. envelope tracking signal or input control signal) and finally multiplied with the inversed DC/DC closed loop transfer function $CL^{-1}$. The resulting voltage $V_{in}$ is the corrected input voltage to the DC/DC converter.

This transformation provides a correction allowing to meet spectral and EVM (error vector magnitude) requirements without increasing the closed loop bandwidth of the DC/DC converter by removing the impact of variations of the power amplifier load.

Figure 4:
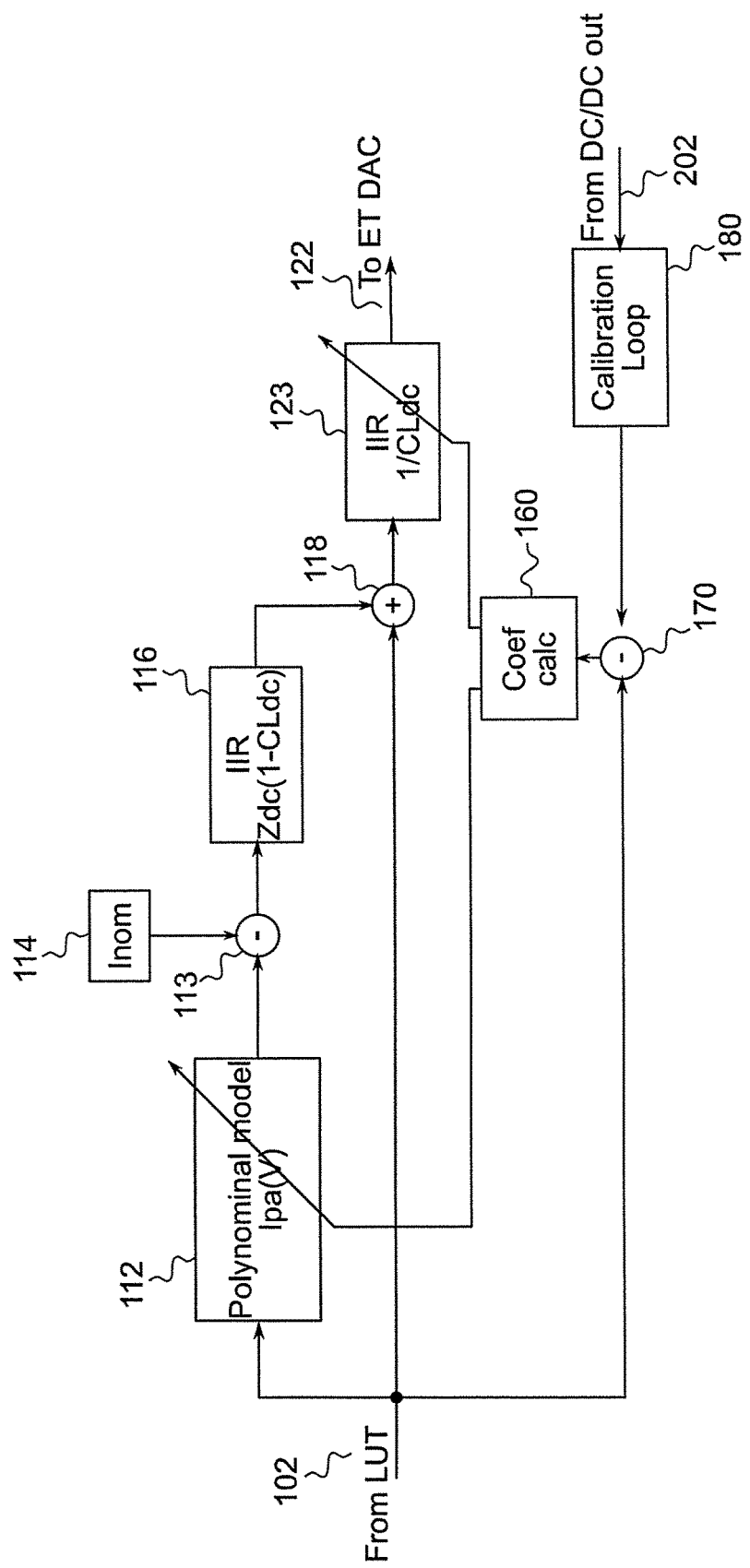
FIG. 4 depicts an apparatus for implementing an adaptive calibration loop feedback.

FIG. 4 depicts an implementation for the apparatus 100 which is configured to carry out the corrections as described in conjunction with equation (1). As a particular example, the apparatus 100 may receive the input signal 102 (e.g. envelope tracking signal or input control signal) from the output of the LUT unit 305 and provides the supply control signal 122 to an input of the DAC 310 as a digital input signal.

The apparatus 100 may comprise an adder 118, which is connected to the input for the input signal 102 via a first signal path, and a second signal path and is configured to add signals from the first signal path (e.g. envelope tracking signal) with signals from the second signal path (e.g. correction signal).

Along the first signal path a current determination unit 112, a subtraction unit 113 and a conversion unit 116 may be formed, wherein the subtraction unit 113 is provided between the current determination unit 112 and the conversion unit 116. The apparatus 100 further comprises a reference unit 114 coupled to the subtraction unit 113. The current determination unit 112 is connected to the input and transmits signals to the subtraction unit 113 which in turn is configured to determine a difference of signals provided from the reference unit 114 (e.g. signal indicating a nominal value) and signals provided from the current determination unit 112 (e.g. forecast signal). The subtraction unit 113 provides the output to the conversion unit 116.

The second signal path can be used for a direct connection between the input for the input signal 102 and the adder 118 to provide the adder 118 with the input signal 102. The adder 118 is configured to add the input signal 102 with the output of the conversion unit 116 and to correct thereby the input signal 102.

For example, the current determination unit 112 is configured to determine a current and to modify a received signal based thereon. The reference unit 114 is configured to provide a reference current $I_{nom}$ and the subtraction unit 113 is configured to determine a deviation of the determined current from the reference current $I_{nom}$. The result determined by the subtraction unit 113 is transmitted to the conversion unit 116, which is configured to convert the determined deviation into a voltage value by applying an impedance value to the current value which is provided as input for the adder 118.

The term "current" refers here and in the following to a signal indicating an (electric) current, e.g. the current flowing through or provided to the power amplifier 300 (as the term $I_{PA}$ in eq. (1)), or the expected current flowing through the power amplifier 300 for a constant load, e.g. expressed in eq. (1) by $V_{PA}/R_{opt}$. Therefore, the signal modified by the current determination unit 112 or the signal provided by the reference unit 114 may merely indicate the respective currents.

The apparatus 100 may further comprise a multiplication unit 123 which receives the output of the adder 118 and is configured to transform the output of the adder 118 to implement the multiplication with the inverse DC/DC closed loop transfer function as expressed by the term $CL^{-1}$ in eq. (1). As a result, a voltage signal that indicates this transformation is generated and output as supply control signal 122.

The current determination unit 112, the subtraction unit 113, the current reference unit 114, and conversion unit 116 may be comprised in the current determination module 110. Therefore, the input signal 102 being processed along the first signal path results in the deviation of the variable controlled power supply 202 from the default value (e.g. stored in the reference unit 114 as reference current).

According to further examples, the current determination unit 112 and/or the multiplication unit 123 may comprise control inputs for respective control signals that are configured to control the determination of the current in the current determination unit 112 and/or the transformation in the multiplication unit 123.

The determination module 110 and/or the adjustment module 120 of the apparatus 100 may be digital signal processing modules or part of a common digital signal processor or base band processor. The determination module 110 and/or the adjustment module 120 of the apparatus 100 may be implemented on the same semiconductor die.

The apparatus 100 may further comprise a calibration module 180, a coefficient determination module 160 and a further subtraction unit 170. These optional components may be configured to implement a closed loop calibration, wherein the variable controlled power supply 202 from the output of the DC supply unit 200 is fed back via the calibration module 180 to control the operations of the components descripted above. For example, the calibration module 180 may be configured to perform a calibration loop and to supply the result to the further subtraction unit 170. The further subtraction unit 170 may be configured to receive the input signal 102 and to determine the difference between the input signal 102 and the output of the calibration module 180. The result is supplied to the coefficient determination unit 160. The coefficient determination unit 160 is connected with the control inputs of the current determination unit 112 and of the multiplication unit 123 to control these units based on the momentary controlled power supply 202.

As a result, the current calculation unit 112 is configured to calculate the current based on the calculated coefficients in the coefficient determination unit 160 and the multiplication unit 123 is configured to convert the resulting voltage from the adder 118 based on the calculated coefficients in the determination unit 160.

Therefore, in this particular implementation the current determination unit 112 is configured to determine the actual current flowing to the power amplifier $I_{PA}$ as a function of the voltage V (see eq. (1)) based on the provided coefficients from the coefficient determination unit 160. To achieve this, the current determination unit 112 may implement a current polynomial model determined by the provided coefficients. The reference current unit 114 may be configured to provide the subtraction unit 113 with the current $I_{nom}$ corresponding to $V_{PA}/R_{opt}$ in eq. (1) representing the current which the DC/DC converter 200 expects to see (based on a constant load assumption). The conversion unit 116 may be configured to multiply the DC/DC closed loop response $(1-CL)$ (see eq. (1)) and the DC/DC output impedance of the open loop $Z_{DC/DC}$ (see eq. (1)). The result of these manipulations of the input signal 102 along the first signal path is the determined deviation obtained by the determination module 110.

The adder 118 and the multiplication unit 123 may be part of the adjustment module 120, which is configured to adjust the input signal 102 based on the determined deviation, for example, by adding both signals in the adder 118 and converting the result in the multiplication unit 123 to take into account the closed loop transfer function. As said before, the multiplication unit 123 may be configured to transform the signal from the adder 118 based on the inverse closed loop transfer function $CL^{-1}$ (see eq. (1)). The result may be transmitted to the envelope tracking digital-analog converter (DAC) as a (digital) supply control signal 122.

Therefore, the system as depicted in FIG. 4 implements the functionalities defined in eq. (1) and changes the time domain behavior of the envelope tracking signal by taking into account the power amplifier load variations and the DC/DC response to it. For example, the coefficients of the power amplifier current model implemented as a polynomial model in the current determination unit 112 and the DC/DC closed loop filter coefficients in the multiplication unit 123 will be adaptively controlled by the possibly slowly varying calibration loop data (e.g. in the calibration unit 180 and the coefficient determination unit 160).

Figure 5:
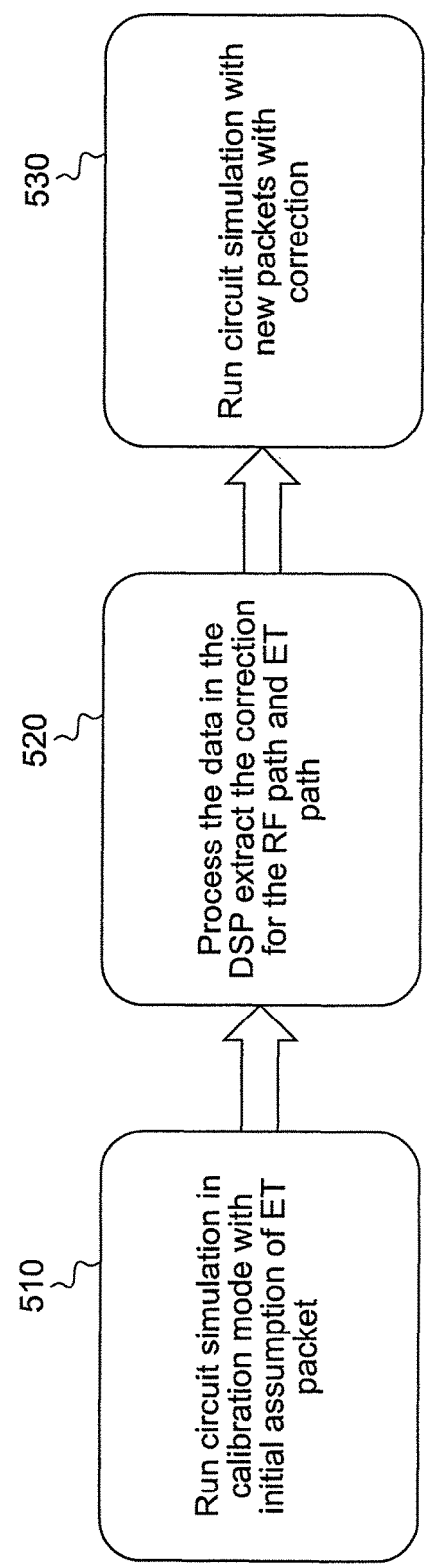
FIG. 5 depicts a simulation flow of a circuit with envelope tracking.

FIG. 5 describes a simulation flow performed for the apparatus 100 as depicted in FIG. 4 to achieve a better understanding of the apparatus 100 and the performance difference as compared to conventional systems.

At first, at block 510, a simulation is run for the calibration process with an initial assumption for the envelope tracking packet. In this block, the data are extracted on the DC/DC response and the power amplifier response from the RF ports (AM/PM data, e.g. the signals 309a, 309b in FIG. 3) and from the supply port (voltage and current; e.g. the controlled supply signal 202, or the Vcc signal in FIG. 3).

At the second block 520, the data are processed in a digital signal processing unit to extract the correction for the RF path (i.e. corrections for the RF input signal 309a resulting in the RF output signal 309b) and the envelope tracking path (from the digital signals 308 via the apparatus 100 to the DC/DC converter 200 to the control/supply input of the power amplifier 300). For example, using MATLAB this data can be used in digital signal processing to extract the corrections needed from the baseband transmitted packet to be sent to the power amplifier 300 and to the DC/DC converter 200 for the supply track.

Finally, at block 530, a full simulation is run with the new packets including the corrections.

Figure 6:
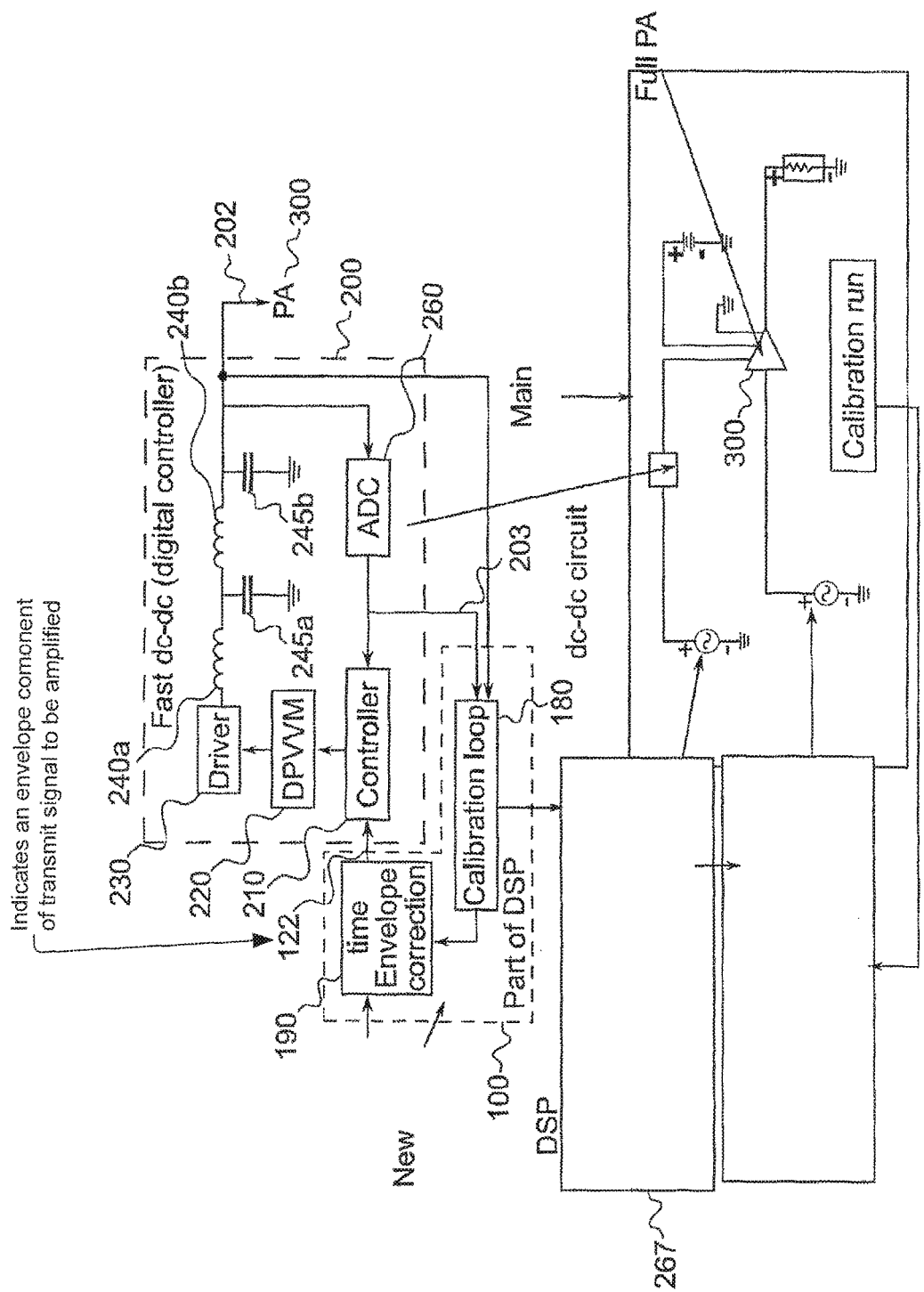
FIG. 6 depicts a block diagram related to the flow chart simulation as shown in FIG. 5.

FIG. 6 depicts a further example for a circuit and the respective digital signal processing simulation of the full envelope tracking system (the apparatus 100 in combination with the power amplifier 300 and the exemplary DC/DC converter 200).

The DC/DC converter 200 comprises in this example a controller 210, a DPWM (digital pulse width modulator) module 220, a driver 230, a first inductance 240a and a second inductance 240b, a first capacitor 245a and a second capacitor 245b, and an analog digital converter (ADC) 260. The controller 210 receives from the apparatus 100 the supply control signal 122 (envelope tracking signal) and is connected to DPWM 220 that is connected to the driver 230 that provides controlled power signal 202 to the power amplifier 300 via the first and second inductances 240. The first capacitor 245a grounds the interconnection between the first and second inductances 240a,b and the second capacitor 245b grounds the output for the controlled power signal 202. Moreover, the DC/DC converter 200 comprises a feedback path to feed back the variable controlled power supply 202 to the controller 210, wherein along the feedback path the analog-digital-converter 260 converts the analog controlled power supply 203 back to the controller 210 as digital signals.

The apparatus 100 comprises the time envelope correction unit 190 and a calibration loop unit (calibration module 180). The calibration module 180 receives the variable controlled power supply 202 from the output of the DC/DC converter 200 as well as its digital value 203 after processing the variable controlled power supply 202 by the ADC 260 and calculates based thereon respective control signals provided to the time envelope correction unit 190. To run the calibration, a digital signal processing unit 267 and the full power amplifier 300 in the calibration module 180 are used, wherein the main simulation includes blocks for the power amplifier 300 and the DC/DC converter 200. Packets that serve as an input to the DC/DC converter 200 and the power amplifier 300 are calculated by the digital signal processing part 267, implemented, for example, in MATLAB based on the data gathered in the calibration process. The main results of the simulation run are shown in FIGS. 7 and 8.

Figure 7:
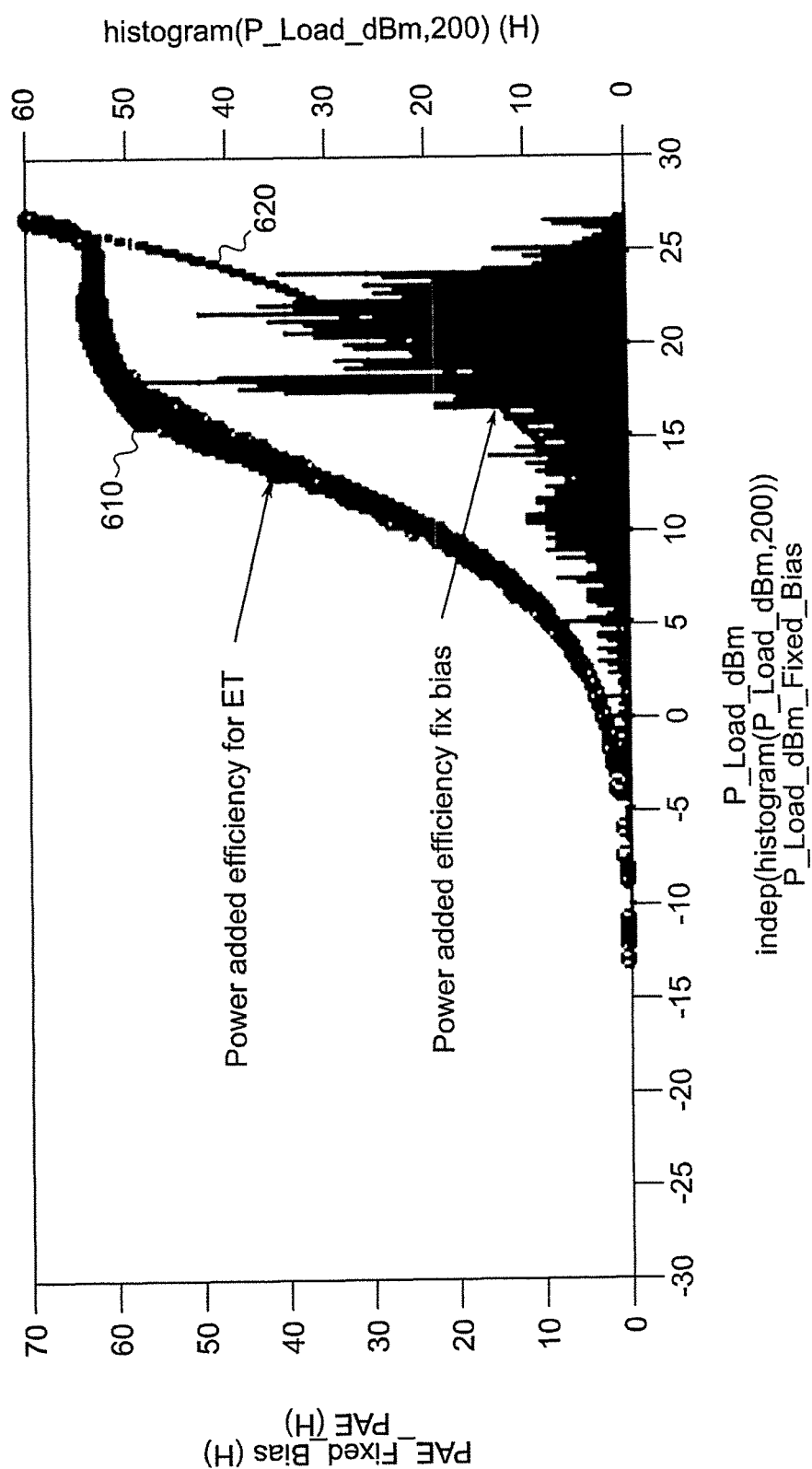
FIG. 7 illustrates the power amplifier efficiency and signal distribution of WiFi40 with and without envelope tracking.

FIG. 7 illustrates the actual improvement of the power amplifier efficiency (PAE) as function of the power load. In particular, the power added efficiency for the envelope tracking 610 and power added efficiency for fixed bias 620 are shown. The simulation was carried out at a 40 MHz WiFi packet with an output power of 20 dBm. For this power, the efficiency of the power amplifier was improved by a factor of two resulting in 200 mW power saving that can be, e.g., more than 25% of the total power consumption.

Figure 8:
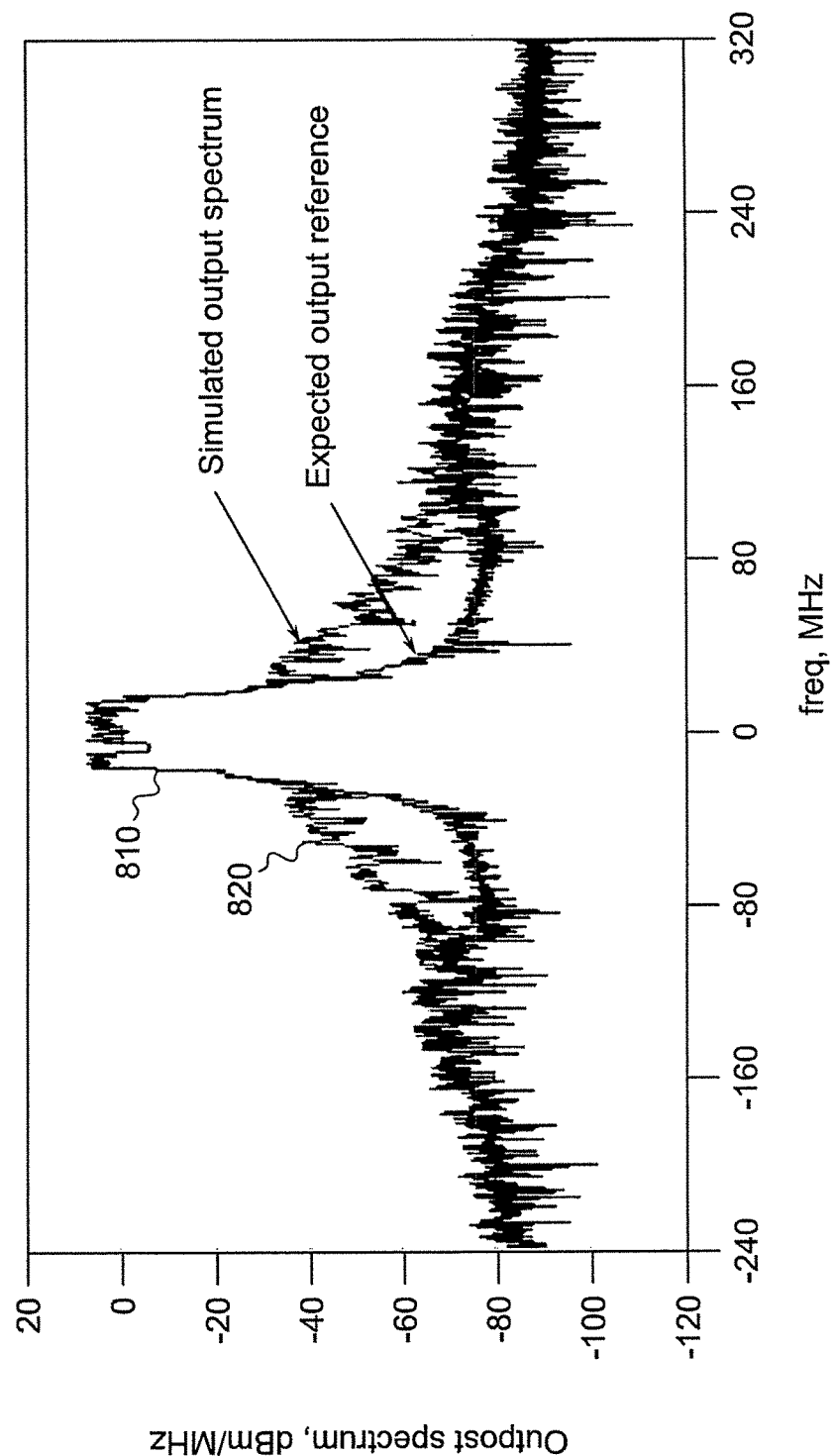
FIG. 8 illustrates the transmission spectrum without open loop compensation.

FIG. 8 illustrates the transmitted output spectrum as function of frequency without open loop compensation according to the present disclosure (i.e. without implementing the apparatus 100). The expected output reference 810 value is based on MATLAB calculation for an ideal case and the simulated output spectrum 820 is shown as the actual spectrum. This spectrum has a noise increase of more than 20 dB in some areas causing it to violate regulatory limits (for example between −80 to −40 MHz and +40 to +80 MHz). The reason for this spectrum regrowth is due to the limited bandwidth of the DC/DC loop that cannot track the load variations of the power amplifier. This is with the best loop implemented in the controller and is working at 300 MHz switching frequency at the DC/DC converter.

Figure 9:
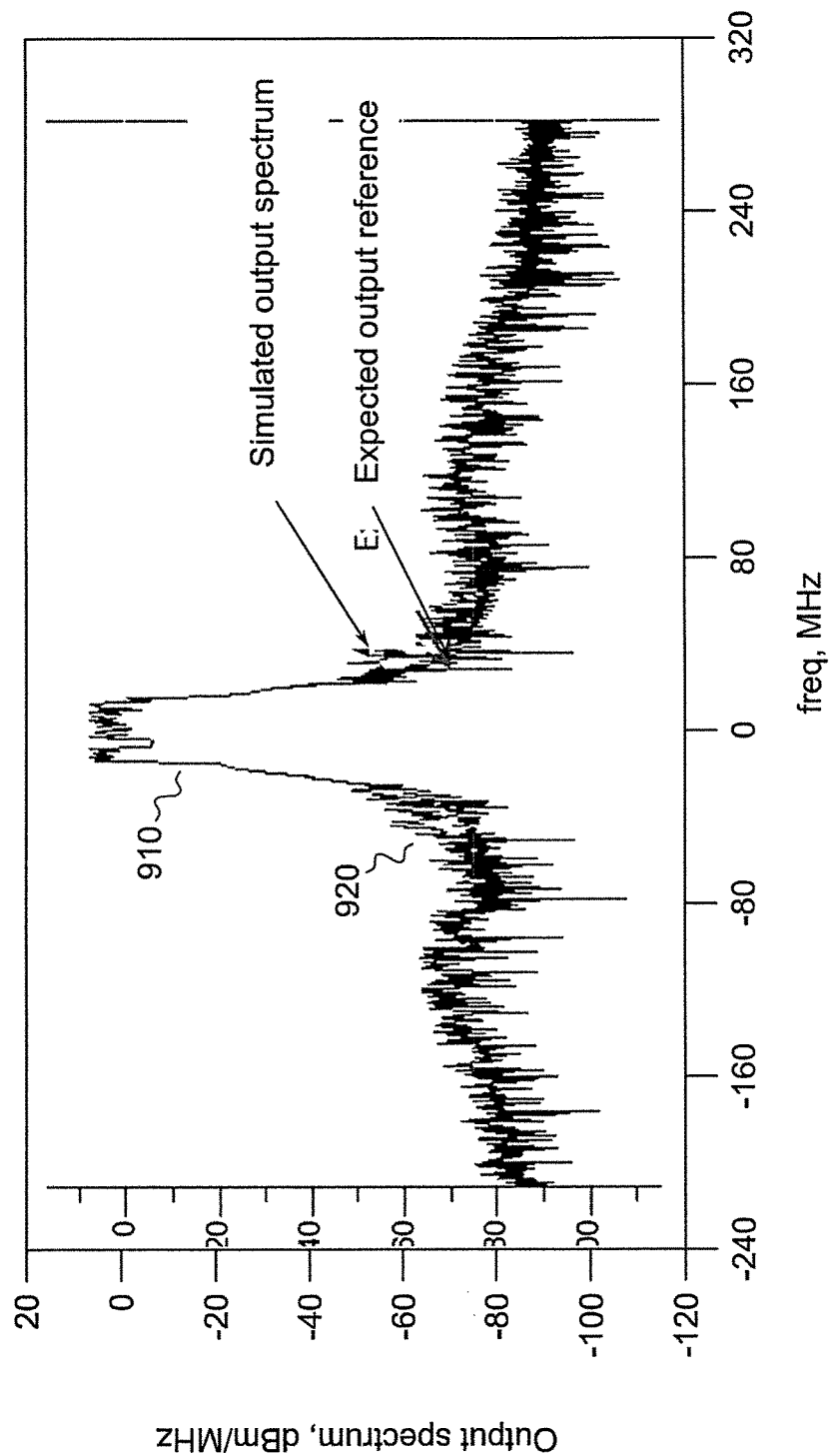
FIG. 9 illustrates the transmission spectrum with open loop compensation.

FIG. 9 illustrates a simulation which has been run again when the open loop correction is added (i.e. with the apparatus 100 implemented). As can be seen in FIG. 9, the simulated output spectrum 920 and the expected output reference 910 do not deviate from each other, contrary to the example shown in FIG. 8 illustrating the achievable improvements when implementing the apparatus 100. Therefore, the final spectrum with the open loop compensation done by the apparatus 100 is very close to the expected result and passes all the regulatory requirements with minimal power addition.

In summary, the proposed correction may reduce the transmission noise of the envelope tracking system by almost 20 dB allowing to reach an efficiency of the envelope tracking driver of close to 90% and a total power saving of around 180 mW (200 mW power amplifier saving with 90% DC efficiency) for 20 dBm output power from the power amplifier and 40 MHz WiFi packet.

Figure 10:
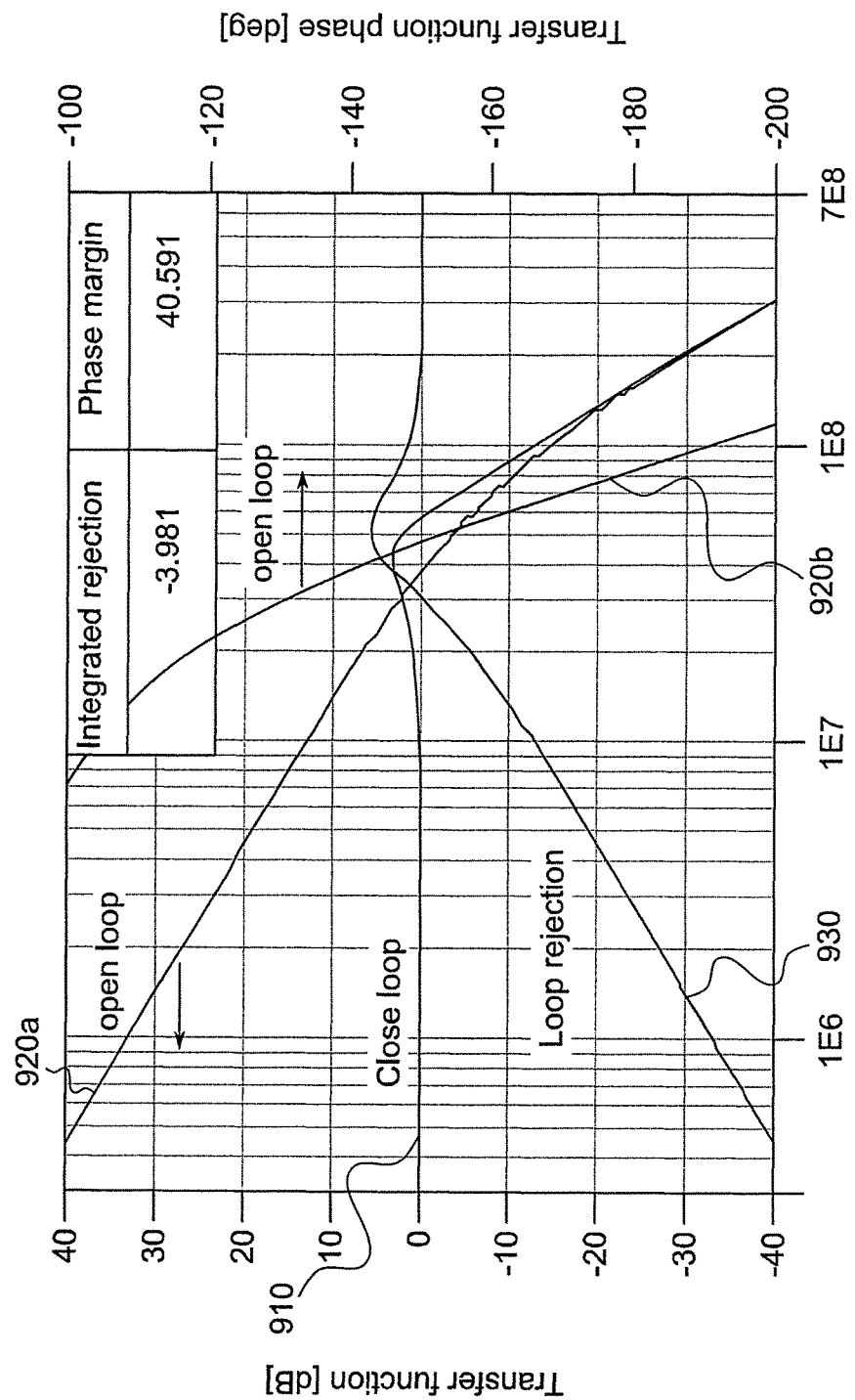
FIG. 10 illustrates the frequency response of the DC/DC amplitude and phase targeted for 40 MHz signals.

In order to understand better the closed loop limitation of the DC/DC converter it is now referred to FIG. 10. FIG. 10 depicts the frequency response of the DC/DC amplitude and phase targeted for 40 MHz signals. FIG. 10 illustrates the transfer function in dependence on the frequency for the close loop 910, the open loop 920a, 920b, and the loop rejection 930. The closed loop (CL) transfer function 910 (bandwidth) can reach up to 60 MHz for a controller working at, e.g., 300 MHz and a switching of, e.g., 150 MHz with dual loop update. The closed loop is good enough to pass 40 MHz signals and achieve a high efficiency DC/DC converter. The loop rejection 930, i.e. (1−CL), shows the amount of rejection that can be obtained from the power amplifier load variation. As can be seen, around 30 MHz, where there are regulatory restrictions, no rejections at all are obtained and even some gain is obtained. This explains the reason of the increased noise in the spectrum as illustrated in FIG. 8.

Figure 11:
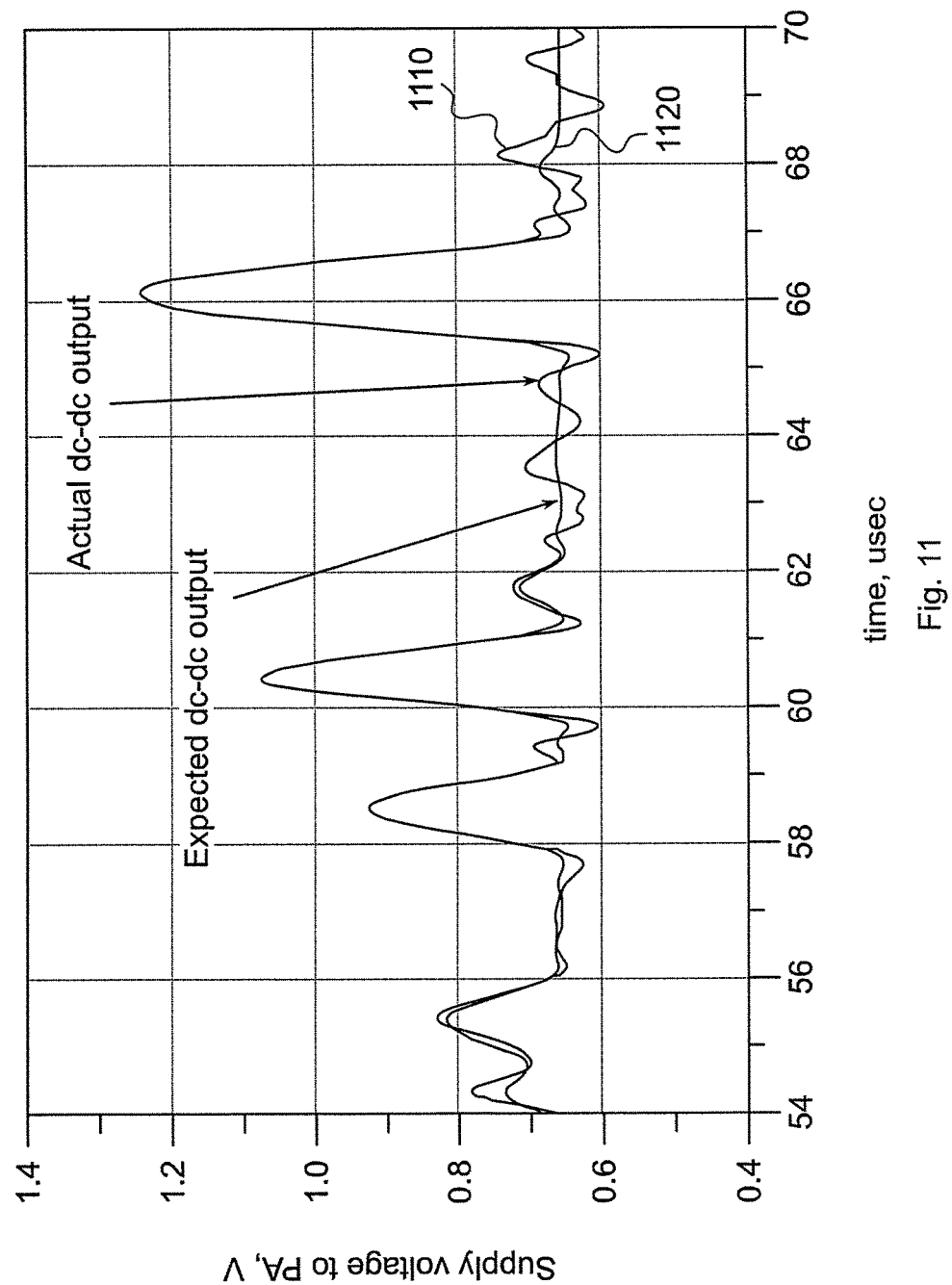
FIG. 11 depicts a DC/DC output voltage without open loop compensation.

FIG. 11 illustrates the supply voltage Vcc to the power amplifies 300 as function of the time and depicts the output voltage of the DC/DC converter 200 (the supply current signal 202) without open loop compensation. The actual DC/DC output 1110 and the expected DC/DC output 1120 are shown. The impact of the load variation of the power amplifier 300 (graph 1110) and no DC/DC rejection (graph 1120) is illustrated in FIG. 11 in the time domain simulation of the DC voltage supplied to the power amplifier 300. Instead of getting the expected DC/DC output voltage 1120, the actual DC/DC output 1110 is obtained which exhibits ripples of up to 100 mV. This again translates to noise shown in the spectrum of FIG. 8.

Without the apparatus 100 described herein, there would be a need to increase the loop bandwidth by more than three times in order to reach a rejection of around 15 dB at the 30 MHz point. This assumption is also validated by simulation. This option is, however, not effective, because reaching a controller speed of close to 1 GHz and more than 500 MHz switching speed would cause a significant degradation of the DC/DC efficiency.

A further improvement of the open loop compensation may be the stability of the solution. Furthermore, the present disclosure addresses the frequency needed to update the compensation variables and repeat the calibration of the DC/DC response and load. From previous system analyses it can be deduced that, if the system parameters change by a few percent, a stable calibration process can be obtained.

Figure 12:
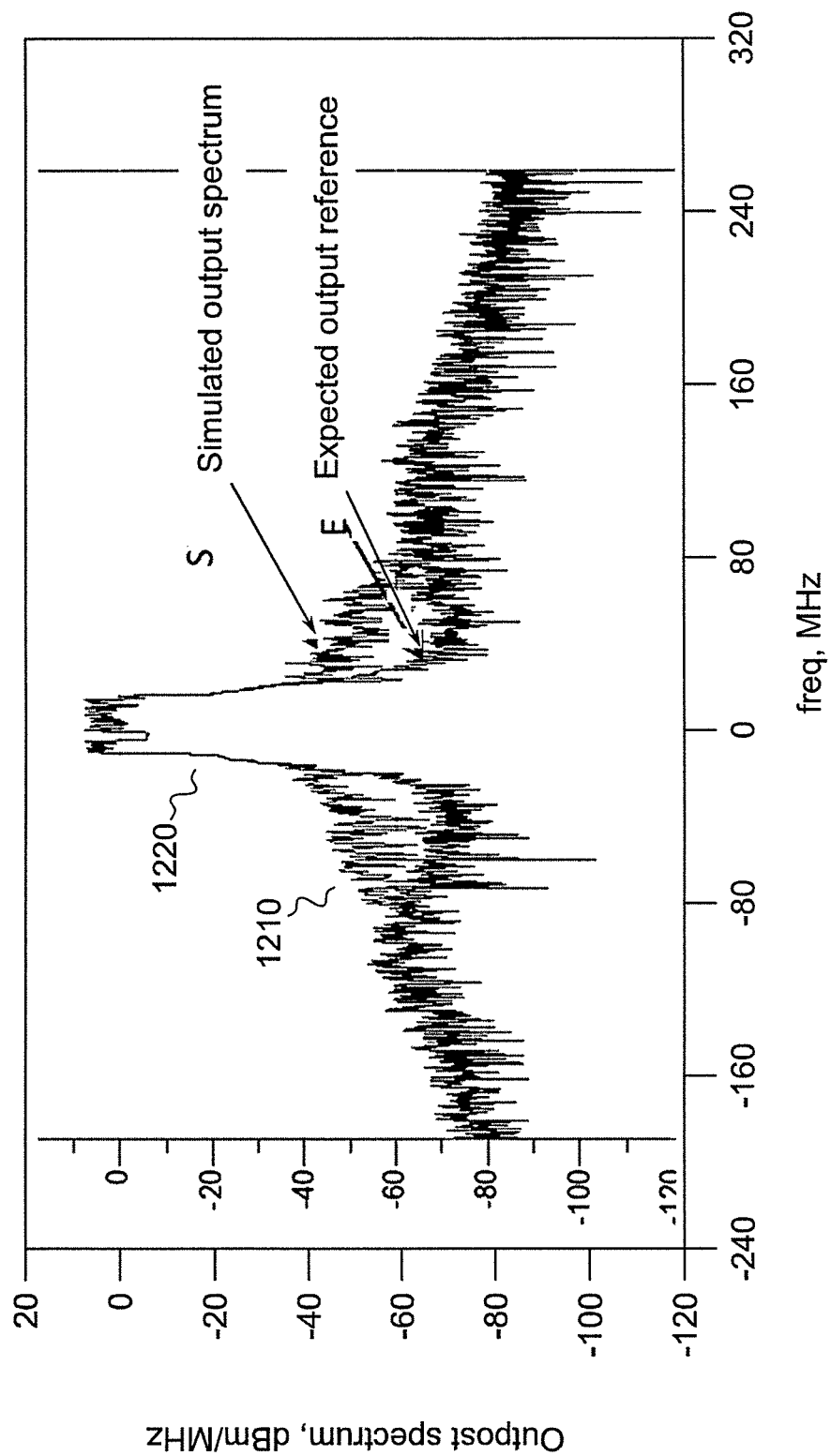
FIG. 12 illustrates a power amplifier output spectrum using a changed DC/DC response and power amplifier load compared to the calibration point.

FIG. 12 illustrates the spectrum achieved for a change of 5% in DC/DC response and power amplifier load compared to the calibration point. The simulated output spectrum 1210 and the expected output reference 1220 are shown which deviate from each other with less than 30 MHz offset. In detail, FIG. 12 depicts the power amplifier output spectrum using a changed DC/DC response and power amplifier load compared to the calibration point. It can be seen even with significant change compared to the calibration, one still gets an improvement with the open loop compensation and path regulatory at 30 MHz offset.

Some examples relate to a transmitter or transceiver comprising an apparatus for providing a supply control signal for a supply unit or an apparatus for providing a calibration signal for adapting a supply control signal for a supply unit according to the proposed concept or one or more examples described above. For example, a radio frequency (RF) device (e.g. a cell phone, a Base Station or another RF communication device) may comprise such a transmitter or a transceiver. A proposed transmitter or transceiver may be used in mobile communication applications, terrestrial broadcasting applications, satellite communication applications, line-of-sight radio applications or radio remote control applications.

Further examples relate to a mobile device (e.g. a cell phone, a tablet or a laptop) comprising a transmitter or a transceiver described above. The mobile device or mobile terminal may be used for communicating in a mobile communication system.

Figure 13:
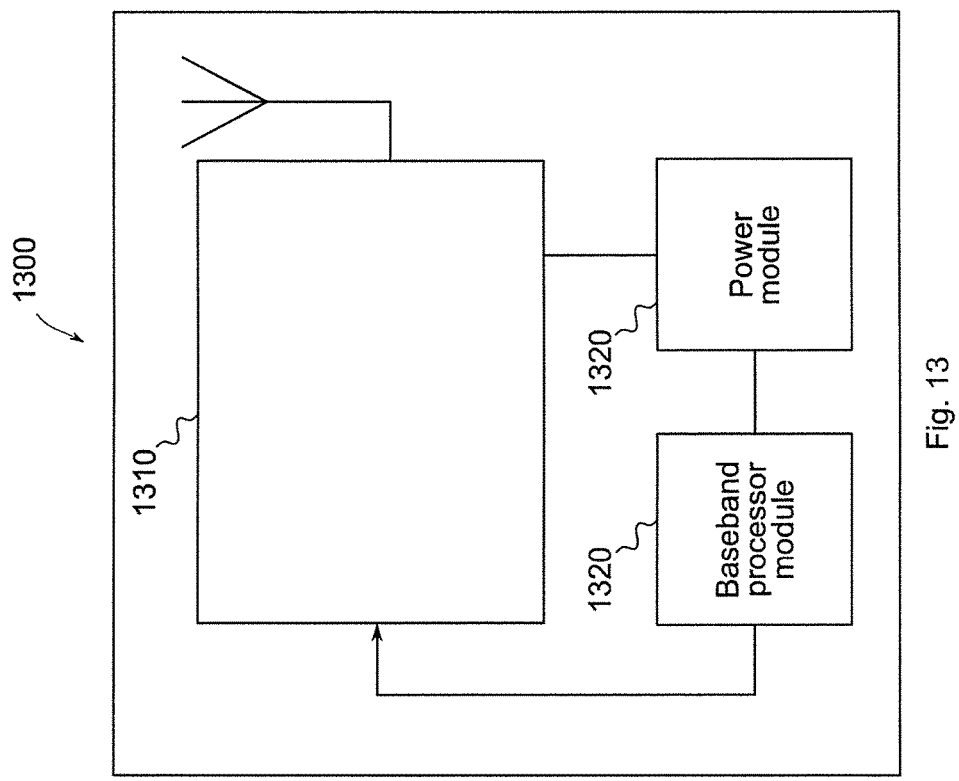
FIG. 13. depicts an mobile device with the apparatus according to the present disclosure.

FIG. 13 shows a schematic illustration of a mobile device 1300 according to an example. The mobile device 1300 comprises an apparatus 1310 for providing a supply control signal for a supply unit or an apparatus 1310 for providing a calibration signal for adapting a supply control signal for a supply unit as described in connection with the proposed concept or one or more examples described above. Further, the mobile device 1300 comprises a baseband processor module 1320 generating a baseband transmit signal and provides the baseband transmit signal to the apparatus 1320. Additionally, the mobile device comprises a power unit 1330 supplying at least the apparatus 1320 and the baseband processor module 1320 with power. Further, the mobile device 1300 comprises an antenna connected to the apparatus 1310.

A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WI-MAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc.

Figure 14:
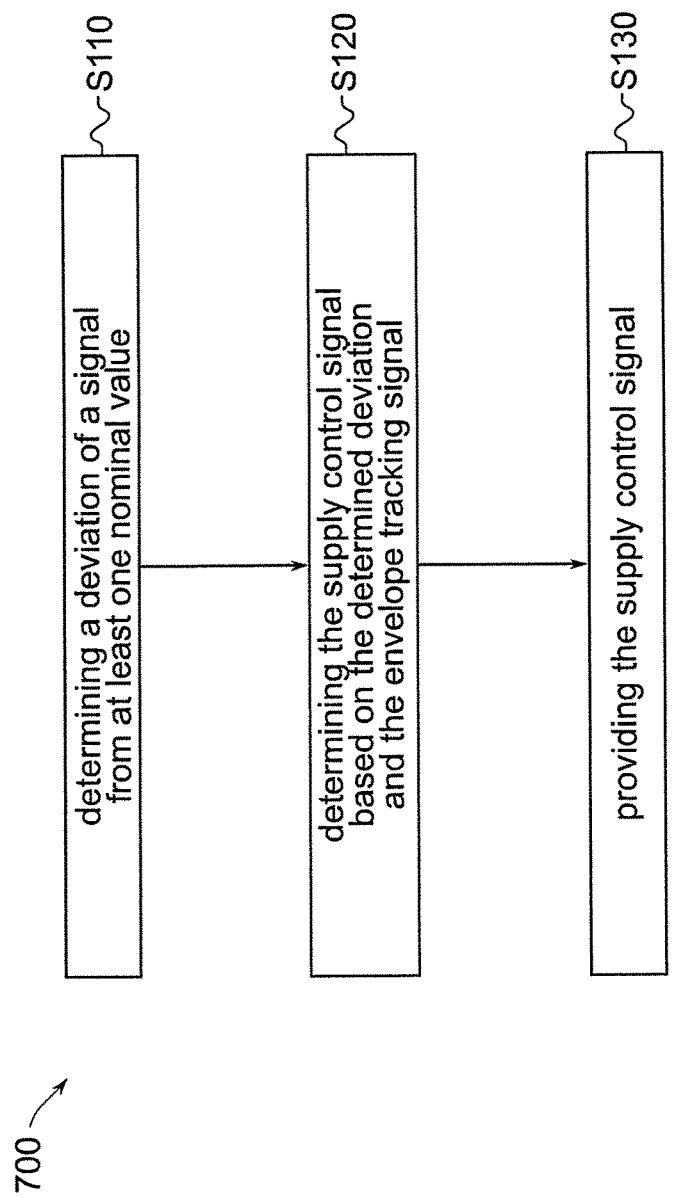
FIG. 14 depicts a flow diagram illustrating a method for providing a supply control signal.

FIG. 14 shows a flow chart of a method 700 for providing a supply control signal 122 for a supply unit 200, the supply unit 200 being configured to provide a variable controlled power supply 202 to the power amplifier 300. The method 700 comprises: determining S110 a deviation of a signal from at least one nominal value, wherein the signal depends on at least one characteristic parameter of the supply unit (200); determining S120 the supply control signal 122 based on the determined deviation and the envelope tracking signal 102; and providing S130 the supply control signal 122.

The method 700 may comprise one or more further optional acts corresponding to one or more aspects mentioned in connection with the proposed concept or one or more examples described above.

In summary, the apparatus 100 provides allow to reduce the transmitted power consumption of wireless devices significantly which is extremely important in handheld devices and all other mobile platforms. It is specifically suited for next generation of WiFi and LTE standards requiring high data rates of up to 80 MHz or even more. In contrast to a pre-distortion technique used in some envelope tracking lookup tables, a time domain correction based on dynamic power amplifier prediction is proposed, for example.

Some examples are set out in the following which are related to further realization of the subject matters disclosed herein.

Figure 15:
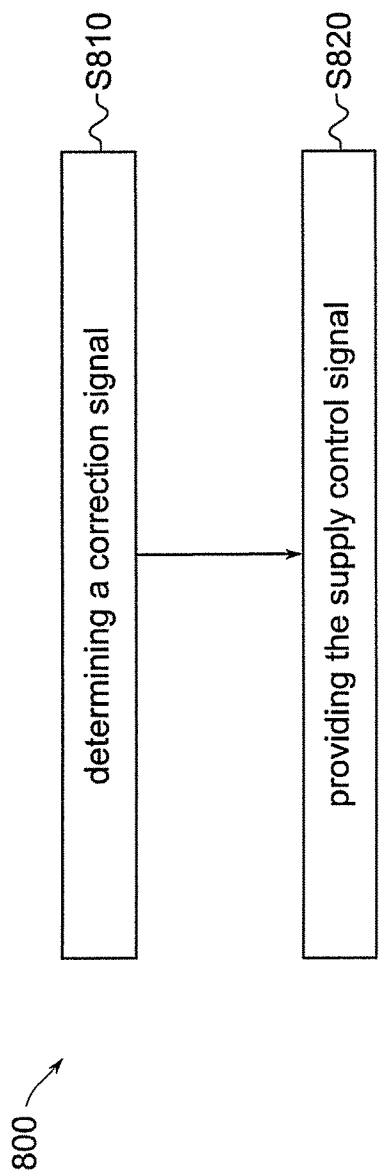
FIG. 15 depicts a flow diagram illustrating a method for correcting a supply control signal.

FIG. 15 shows a flow chart of a method 800 for providing a supply control signal for a supply unit according to an example. The supply unit is configured to provide a variable controlled power supply based on the supply control signal to a power amplifier. The power amplifier is configured to amplify a transmit signal. The method 800 comprises determining S810 a correction signal based on at least one characteristic parameter of the supply unit and providing S820 the supply control signal based on the correction signal and an input control signal containing information on an envelope of the transmit signal to be amplified by the power amplifier.

The method 800 may comprise one or more further optional acts corresponding to one or more aspects mentioned in connection with the proposed concept or one or more examples described above.

Figure 16:
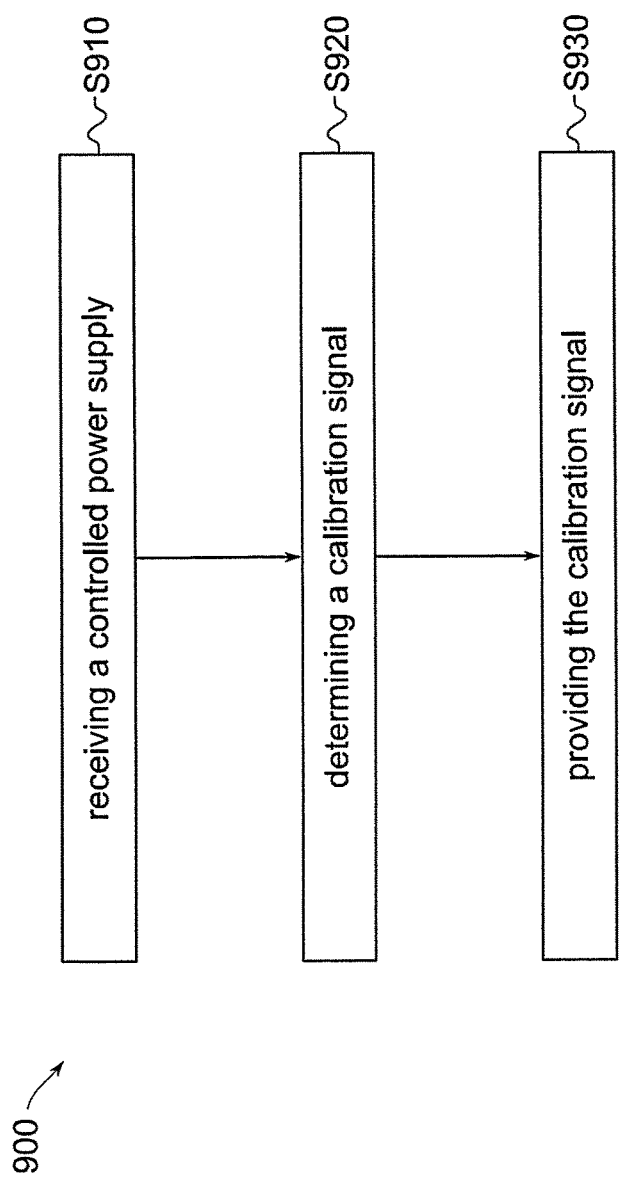
FIG. 16 depicts a flow diagram illustrating a method for providing a calibration signal.

FIG. 16 shows a flow chart of a method 900 for providing a calibration signal for adapting a supply control signal for a supply unit according to an example. The supply unit is configured to provide a variable controlled power supply based on the supply control signal to a power amplifier. The method 900 comprises receiving S910 a variable controlled power supply from an output of the supply unit and determining S920 a calibration signal based on the variable controlled power supply and based on an envelope tracking signal. Further, the method 900 comprises providing S930 the calibration signal configured to adapt the supply control signal.

The method 900 may comprise one or more further optional acts corresponding to one or more aspects mentioned in connection with the proposed concept or one or more examples described above.

Some examples relate to a time domain open loop envelope tracking compensation for bandwidth enhancement.

According to the proposed concept, a fast DC/DC converter without having a linear regulator assistance and which is operable beyond 100 MHz switching frequencies may be provided. Such solution may be able to reach the bandwidth required for new wireless standards as LTE (Long Term Evolution) and WiFi and still maintains good efficiency.

Example 1 is an apparatus 100 for providing a supply control signal 122 for a supply unit 200, the supply unit 200 being configured to provide a variable controlled power supply 202 to the power amplifier 300. The apparatus 100 comprises a determination module 110 configured to determine a deviation of a signal from at least one nominal value, wherein the signal is based on at least one characteristic parameter of the supply unit 200. The apparatus further comprises an adjustment module 120 configured to provide the supply control signal 122 after an adjustment based on the determined deviation and an envelope tracking signal 102.

In example 2, in the subject matter of example 1 the at least one nominal value can optionally indicate a value of the variable controlled power supply 202 to be supplied by the supply unit 200 for a constant or slowly varying load of the power amplifier 300.

In example 3, the subject matter according to example 1 or example 2 can optionally comprise a calibration module 180 which is configured to receive the variable controlled power supply 202 and to provide a calibration signal 103 for the determination module 110 and/or the adjustment module 120 to define a feedback loop to dynamically adjust the supply control signal 122 based on the variable controlled power supply 202.

In example 4, the subject matter according to one of examples 1 to 3 can optionally be configured to receive the envelope tracking signal 102, and the envelope tracking signal 102 indicates an envelope component of a digital signal to be amplified by the power amplifier 300.

In example 5, the subject matter 100 according to one of examples 1 to 4 the determination module 110 can optionally comprise a current determination unit 112, wherein the current determination unit 112 is configured to receive the envelope tracking signal 102 and to determine the signal based thereon, and wherein the at least one characteristic parameter indicates a current signal flowing to the power amplifier 300.

In example 6, the subject matter 100 according to one of examples 1 to 5 can optionally include the determination module 110 to comprise a reference unit 114 configured to provide a reference current value that indicates the at least one nominal value.

In example 7, the subject matter 100 according to example 6 can optionally include the determination module 110 to comprise a subtraction unit 113 configured to determine a difference between the signal and the reference current provided by the reference unit 114 to determine the deviation based thereon.

In example 8, the subject matter 100 according to one of examples 1 to 7 can optionally include the adjustment module 120 to comprise a combiner 118, wherein the combiner 118 is configured to receive the envelope tracking signal 102, to receive a signal indicative of the deviation, and to combine the envelope tracking signal 102 and the signal indicative of the deviation.

In example 9, the subject matter 100 according to example 8 can optionally include the combiner 118 to be an adder.

In example 10, the subject matter 100 according to example 8 or example 9 can optionally include the adjustment module 120 to comprise a determining unit 123 configured to receive and convert a result from the combiner 118 to generate the supply control signal 122.

In example 11, the subject matter 100 according to example 10 can optionally include the determining unit 123 to be a multiplication unit.

In example 12, the subject matter 100 according to example 10 or example 11 can optionally include a conversion unit 116 which is arranged between the subtraction unit 113 and the combiner 118 to receive an output of the subtraction unit 113 indicative of the deviation and to provide a transformed signal to the combiner 118, wherein the transformed signal is transformed based on an impedance of the supply unit 200.

In example 13, the subject matter 100 according to one of examples 10 and 12 can optionally include a coefficient determination unit 160.

In example 14, the subject matter 100 according to example 13 can optionally include a combiner unit 170, wherein the combiner unit 170 is configured to receive the calibration signal 103 from the calibration module 180 and the envelope tracking signal 102, and to determine a difference of the envelope tracking signal 102 and the calibration signal 103, and to supply the coefficient determination unit 160 with a signal based on the difference of the envelope tracking signal 102 and the calibration signal 103, and wherein the coefficient determination unit 160 is configured to determine, based on the received signal from the combiner unit 170, control coefficients, and to supply the control coefficients to the determining unit 123 or to supply the control coefficients to the current determination unit 112.

In example 15, the subject matter 100 according to example 14 can optionally include the current determination unit 112 to be configured to transform the envelope tracking signal 102 based on the supplied control coefficients which are indicative of a current flowing to the power amplifier 300.

In example 16, the subject matter 100 according to example 15 can optionally include the transformation in the current determination unit 112 to be based on a polynomial model which is parameterized by the control coefficients.

In example 17, the subject matter 100 according to one of examples 6 to 16 can optionally include the reference unit 114 to comprise a storage to store the at least one nominal value which is indicative of an expected current from the supply unit 200.

In example 18, the subject matter 100 according to example 17 can optionally include the expected current to be indicative of a particular supply control signal 122 enabling the supply unit 200 to control the power amplifier 300 to provide a predetermined amplification when the power amplifier 300 comprises a constant impedance.

In example 19, the subject matter 100 according to one of examples 12 to 18 can optionally include the conversion unit 116 to be configured to multiply the output of the subtraction unit 113 with a factor indicative of at least one of the impedance of the supply unit 200 and a closed loop transfer function.

In example 20, the subject matter 100 according to one of examples 13 to 19 can optionally include the combiner unit 123 to be configured to convert the result from the combiner 118 by an operation indicative of a multiplication of the output with an inverse of the closed loop transfer function based on the control coefficients received from the coefficient determination unit 160 and based thereon to convert the signal received from the combiner 118 to generate the supply control signal 122.

In example 21, the subject matter 100 according to one of the preceding examples can optionally be configured to correct the supply control signal 122 based on time domain signals.

Example 22 is an apparatus 100 for providing a supply control signal 122 for a supply unit 200, the supply unit 200 being configured to provide a variable controlled power supply 202 based on the supply control signal 122 to a power amplifier 300, wherein the power amplifier 300 is configured to amplify a transmit signal. The apparatus 100 comprises: a determination module 110 configured to determine a correction signal based on at least one characteristic parameter of the supply unit 200; and an adjustment module 120 configured to provide the supply control signal 122 based on the correction signal and an input control signal 102 containing information on an envelope of the transmit signal to be amplified by the power amplifier 300.

In example 23, the subject matter 100 according to example 22 can optionally include the determination module 110 to comprise a current determination unit 112, wherein the current determination unit 112 is configured to receive the input control signal 102 and to determine the correction signal based thereon, and wherein the at least one characteristic parameter is indicative of a current signal flowing to the power amplifier 300.

In example 24, the subject matter 100 according to example 22 or 23 can optionally include the determination module 110 to comprise a reference unit 114 configured to provide a reference current value indicative of a value of the variable controlled power supply 202 to be supplied by the supply unit 200 for a constant or slowly varying load of the power amplifier 300.

In example 25, the subject matter 100 according to example 24 can optionally include the determination module 110 to comprise a subtraction unit 113 configured to determine a difference between a signal and the reference current provided by the reference unit 114 to determine the deviation based thereon, wherein the signal depends on at least one characteristic parameter of the supply unit 200.

In example 26, the subject matter 100 according to one of examples 22 to 25 can optionally include the adjustment module 120 to comprise a combiner 118, wherein the combiner 118 is configured to receive the input control signal 102, to receive the correction signal, and to combine the input control signal 102 and the correction signal.

In example 27, the subject matter 100 according to example 26 can optionally include the combiner 118 as an adder.

In example 28, the subject matter 100 according to example 26 or example 27 can optionally include the adjustment module 120 to comprise a determining unit 123 configured to receive and convert a result from the combiner 118 to generate the supply control signal 122.

In example 29, the subject matter 100 according to example 28 can optionally include the determining unit 123 as a multiplication unit.

In example 30, the subject matter 100 according to one of examples 26 to 29 can optionally include a conversion unit 116 which is arranged between the subtraction unit 113 and the combiner 118 to receive an output of the subtraction unit 113 indicative of the difference and to provide a transformed signal to the combiner 118, wherein the transformed signal is transformed based on an impedance of the supply unit 200.

In example 31, the subject matter 100 according to one of examples example 22 to 30 can optionally include a calibration module 180 which is configured to derive at least one control coefficient based on the variable controlled power supply 202 and to control the determination module 100 or to the adjustment module 120 based on the at least one control coefficient.

Example 32 is an apparatus 180 for providing a calibration signal 103 for a supply control signal 122 for a supply unit 200 using a feedback loop to correct a supply control signal 122, the supply unit 200 being configured to provide a variable controlled power supply 202 based on the supply control signal 122 to the power amplifier 300. The apparatus 180 comprises: an input 181 to receive a variable controlled power supply 202 from an output of the supply unit 200 and an output 182 to provide a calibration signal 103 configured to correct the supply control signal 122; and a calibration module configured to determine the calibration signal 103 based on the variable controlled power supply 202 and based on an envelope tracking signal 102.

In example 33, the subject matter 180 according to example 32 can optionally include the calibration module to be further configured to provide the calibration signal 103 based on a response from an output port of the power amplifier 300 caused by a variation of a load connected to the output port of the power amplifier 300.

In example 34, the subject matter 180 according to example 32 or example 33 can optionally include a coefficient determination unit 160 configured to determine coefficient signals, the coefficient signals are indicative of at least one parameter of the power supply 200 and/or the power amplifier 300.

In example 35, the subject matter 180 according to example 34 can optionally include a coupling unit configured to couple to the apparatus 100 for providing a supply control signal 122 according to example 1, the apparatus 180 further comprising a combiner unit 170 configured to determine a deviation of the envelope tracking signal 102 and the calibration signal 103 and to supply a signal based on the difference to the coefficient determination unit 160.

Example 36 is a system 400 for amplifying digital signals 308. The system 400 comprises: an apparatus 100 for providing a supply control signal 122 according to one of examples 1 to 23; an apparatus 180 for providing a calibration signal according to one of examples 32 to 35; a supply unit 200 controlled by the supply control signals 122 and configured to supply the controlled supply signal 202; and a power amplifier 300 supplied with the controlled supply signal 202 to control an amplification of the power amplifier 300.

In example 37, the subject matter 400 according to example 36 can optionally include an envelope tracking module 340 configured to receive the digital signals 308 and to provide an envelope signal.

In example 38, the subject matter 400 according to example 37 can optionally include a mapping unit 305 configured to receive the envelope signal and to map the envelope signal to the envelope tracking signal 102 based on a characteristic of the power amplifier 300 or the supply unit 200.

In example 39, the subject matter 400 according to example 38 can optionally include the mapping unit 305 to comprise a look-up table (LUT).

In example 40, the subject matter 400 according to one of examples 36 to 39 can optionally include a modulator 320 configured to receive and to modulate the digital signals 308.

In example 41, the subject matter 400 according to example 40 can optionally include a multiplexer 330 configured to provide a multiplexed signal 309*a* to the power amplifier 300 as input signal to be amplified.

In example 42, the subject matter 400 according to examples 36 to 41 can optionally include a power supply 250 which is configured to provide a DC power supply to the supply unit 200.

In example 43, the subject matter 400 according to one of the examples 36 to 42 can optionally include the supply unit 200 to be a DC/DC supply unit.

Example 44 is an apparatus 100 for providing a supply control signal 122 for a supply unit 200 based on an envelope tracking signal 102, the supply unit 200 being configured to provide a variable controlled power supply 202 to the power amplifier 300. The apparatus 100 comprises: means 110 for determining a deviation of a signal from at least one nominal value, wherein the signal depends on at least one characteristic parameter of the supply unit 200; means 120 for determining the supply control signal 122 based on the determined deviation and the envelope tracking signal 102, and for providing the supply control signal 122.

In example 45, the subject matter 100 according to example 44 can optionally include: means for receiving the variable controlled power supply 202; and means 180 for providing a calibration signal 103 for the means for determining 110 and/or the means for determining 120 the supply control signal 122 to define a feedback loop for an dynamically adjustment of the determination of the supply control signal 122 based on the variable controlled power supply 202.

Example 46 is a transmitter or a transceiver comprising an apparatus according to one of the previous examples.

Example 47 is a mobile device comprising a transmitter or a transceiver according to example 46.

Example 48 is a cell phone comprising a transmitter or a transceiver according to example 46.

Example 49 is a method 700 for providing a supply control signal 122 for a supply unit 200 based on an envelope tracking signal 102, the supply unit 200 being configured to provide a variable controlled power supply 202 to the power amplifier 300. The method 700 comprises: determining S110 a deviation of a signal from at least one nominal value, wherein the signal depends on at least one characteristic parameter of the supply unit 200; determining S120 the supply control signal 122 based on the determined deviation and the envelope tracking signal 102; and providing S130 the supply control signal 122.

In example 50, the subject matter according to example 49 can optionally include: receiving the variable controlled power supply 202; and providing a calibration signal 103 for the act of determining S110 the deviation and/or for the act determining S120 the supply control signal 122 to define a feedback loop to dynamically adjust the supply control signal 122 based on the variable controlled power supply 202.

Example 51 is a method for providing a supply control signal for a supply unit, the supply unit being configured to provide a variable controlled power supply based on the supply control signal to a power amplifier, wherein the power amplifier is configured to amplify a transmit signal, the method comprising determining a correction signal based on at least one characteristic parameter of the supply unit and providing the supply control signal based on the correction signal and an input control signal containing information on an envelope of the transmit signal to be amplified by the power amplifier.

In example 52, the subject matter according to example 51 can optionally include receiving the input control signal and determining a forecast signal based thereon, and wherein the at least one characteristic parameter is indicative of a current signal flowing to the power amplifier.

Example 53 is a method for providing a calibration signal for adapting a supply control signal for a supply unit, the supply unit being configured to provide a variable controlled power supply based on the supply control signal to a power amplifier, the method comprising receiving a variable controlled power supply from an output of the supply unit, determining a calibration signal based on the variable controlled power supply and based on an envelope tracking signal and providing the calibration signal configured to adapt the supply control signal.

In example 54, the subject matter according to example 53 can optionally include providing the calibration signal based on an influence of a variation of a load connected to an output port of the power amplifier to the variable controlled power supply.

Example 55 is a machine readable storage medium including program code, when executed, to cause a machine to perform a claimed method.

Example 56 is a machine readable storage including machine readable instructions, when executed, to implement a method or realize an apparatus as in any pending examples.

Example 57 is a computer program having a program code for performing a claimed method, when the computer program is executed on a computer or processor.

The apparatus may comprise one or more additional optional features corresponding to one or more aspects mentioned in connection with the proposed concept or one or more examples described above.

Some examples relate to a transmitter or transceiver comprising an apparatus for determining information on an amplitude error of a transmit signal according to the proposed concept or one or more examples described above. For example, a radio frequency (RF) device (e.g. a cell phone, a Base Station or another RF communication device) may comprise such a transmitter or a transceiver. A proposed transmitter or transceiver may be used in mobile communication applications, terrestrial broadcasting applications, satellite communication applications, line-of-sight radio applications or radio remote control applications.

Further examples relate to a mobile device (e.g. a cell phone, a tablet or a laptop) comprising a transmitter or a transceiver described above. The mobile device or mobile terminal may be used for communicating in a mobile communication system.

In some examples, a cell phone may comprise a transmitter or a transceiver comprising an apparatus for determining information on an amplitude error of a transmit signal according to the proposed concept or one or more examples described above.

Further, some examples relate to a base station or a relay station of a mobile communication system comprising a transmitter or a transceiver with an apparatus for determining information on an amplitude error of a transmit signal according to the described concept or one or more examples described above.

The method may comprise one or more additional optional acts corresponding to one or more aspects mentioned in connection with the proposed concept or one or more examples described above.

In the following examples pertain to further examples.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus for providing a supply control signal for a supply unit, the supply unit being configured to provide a variable controlled power supply to a power amplifier, the apparatus comprising:
  a determination module configured to determine a deviation of a forecast signal from at least one nominal value, wherein the forecast signal is based on at least one characteristic parameter of the supply unit; and
an adjustment module configured to provide the supply control signal after an adjustment based on the determined deviation and an envelope tracking signal,
wherein the determination module comprises a current determination unit, wherein the current determination unit is configured to receive the envelope tracking signal and to determine the forecast signal based on the envelope tracking signal, wherein the at least one characteristic parameter indicates a current signal flowing to the power amplifier.

2. The apparatus according to claim 1, wherein the at least one nominal value indicates a value of the variable controlled power supply supplied by the supply unit for a constant or slowly varying load of the power amplifier.

3. The apparatus according to claim 1, wherein the apparatus is configured to receive the envelope tracking signal, wherein the envelope tracking signal indicates an envelope component of a transmit signal to be amplified by the power amplifier.

4. An apparatus for providing a supply control signal for a supply unit, the supply unit being configured to provide a variable controlled power supply to a power amplifier, the apparatus comprising:
a determination module configured to determine a deviation of a forecast signal from at least one nominal value, wherein the forecast signal is based on at least one characteristic parameter of the supply unit, and wherein the determination module comprises a reference unit configured to provide a reference current value that indicates the at least one nominal value; and
an adjustment module configured to provide the supply control signal after an adjustment based on the determined deviation and an envelope tracking signal,
wherein the determination module comprises a subtraction unit configured to determine a difference between the forecast signal and the reference current value provided by the reference unit to determine the deviation based thereon.

5. An apparatus for providing a supply control signal for a supply unit, the supply unit being configured to provide a variable controlled power supply to a power amplifier, the apparatus comprising:
a determination module configured to determine a deviation of a forecast signal from at least one nominal value, wherein the forecast signal is based on at least one characteristic parameter of the supply unit; and
an adjustment module configured to provide the supply control signal after an adjustment based on the determined deviation and an envelope tracking signal,
wherein the adjustment module comprises a combiner, wherein the combiner is configured to receive the envelope tracking signal, to receive a signal that indicates the deviation, and to combine the envelope tracking signal and the signal that indicates the deviation.

6. The apparatus according to claim 5, wherein the adjustment module comprises a determining unit configured to receive and convert a result from the combiner to generate the supply control signal.

7. The apparatus according to claim 4, further comprising:
a combiner, wherein the combiner is configured to receive the envelope tracking signal, to receive a signal that indicates the deviation, and to combine the envelope tracking signal and the signal that indicates the deviation; and
a conversion unit arranged between the subtraction unit and the combiner to receive an output of the subtraction unit that indicates the deviation and to provide a transformed signal to the combiner, wherein the transformed signal is transformed based on an impedance of the supply unit.

8. The apparatus according to claim 7, wherein the conversion unit is configured to multiply the output of the subtraction unit with a factor that indicates at least one of the impedance of the supply unit and a closed loop transfer function.

9. The apparatus according to claim 1, further comprising a calibration module which is configured to receive the variable controlled power supply and to provide a calibration signal for the determination module and/or the adjustment module to define a feedback loop to dynamically adjust the supply control signal based on the variable controlled power supply.

10. The apparatus according to claim 9, further comprising a combiner unit, wherein the combiner unit is configured to receive the calibration signal from the calibration module and the envelope tracking signal, and to determine a difference of the envelope tracking signal and the calibration signal.

11. An apparatus for providing a supply control signal for a supply unit, the supply unit being configured to provide a variable controlled power supply based on the supply control signal to a power amplifier, wherein the power amplifier is configured to amplify a transmit signal, the apparatus comprising:
a determination module configured to determine a correction signal based on at least one characteristic parameter of the supply unit; and
an adjustment module configured to provide the supply control signal based on the correction signal and an input control signal containing information on an envelope of the transmit signal to be amplified by the power amplifier,
wherein the determination module comprises a current determination unit, wherein the current determination unit is configured to receive the input control signal and to determine a forecast signal based thereon, and wherein the at least one characteristic parameter indicates a current signal flowing to the power amplifier.

12. An apparatus for providing a calibration signal for adapting a supply control signal for a supply unit, the supply unit being configured to provide a variable controlled power supply based on the supply control signal to a power amplifier, the apparatus comprising:
an input configured to receive a variable controlled power supply from an output of the supply unit and an output to provide a calibration signal configured to adapt the supply control signal;
a calibration module configured to determine the calibration signal based on the variable controlled power supply and based on an envelope tracking signal;
a coupling unit;
a determination module configured to determine a deviation of a forecast signal from at least one nominal value, wherein the forecast signal is based on at least one characteristic parameter of the supply unit;
an adjustment module configured to provide the supply control signal after an adjustment based on the determined deviation and an envelope tracking signal;

a coefficient determination unit configured to determine coefficient signals, wherein the coefficient signals indicate at least one parameter of the power supply and/or the power amplifier; and a combiner unit configured to determine a difference between the envelope tracking signal and the calibration signal and to supply a signal based on the difference to the coefficient determination unit, wherein the coupling unit is configured to couple to the apparatus for providing a supply control signal.

13. The apparatus according to claim 12, wherein the calibration module is further configured to provide the calibration signal based on an influence of a variation of a load connected to an output port of the power amplifier to the variable controlled power supply.

* * * * *